US012640696B2

(12) United States Patent
Hasebe

(10) Patent No.: US 12,640,696 B2
(45) Date of Patent: May 26, 2026

(54) SEMICONDUCTOR CIRCUIT

(71) Applicant: SONY SEMICONDUCTOR SOLUTIONS CORPORATION, Kanagawa (JP)

(72) Inventor: Kazunori Hasebe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 525 days.

(21) Appl. No.: 18/042,009

(22) PCT Filed: Jul. 7, 2021

(86) PCT No.: PCT/JP2021/025552
§ 371 (c)(1),
(2) Date: Feb. 17, 2023

(87) PCT Pub. No.: WO2022/049888
PCT Pub. Date: Mar. 10, 2022

(65) Prior Publication Data
US 2023/0336135 A1      Oct. 19, 2023

(30) Foreign Application Priority Data

Sep. 1, 2020      (JP) ................................. 2020-146748

(51) Int. Cl.
*H03F 3/387*          (2006.01)
*H03F 1/26*           (2006.01)
(Continued)

(52) U.S. Cl.
CPC .............. *H03F 3/387* (2013.01); *H03F 1/26* (2013.01); *H03F 3/005* (2013.01); *H03F 3/45071* (2013.01); *H03F 2200/271* (2013.01)

(58) Field of Classification Search
CPC . H03F 3/387; H03F 1/26; H03F 3/005; H03F 3/45071; H03F 2200/271; H03F 3/45475
(Continued)

(56) References Cited

U.S. PATENT DOCUMENTS

| | | | |
|---|---|---|---|
| 8,829,988 B2 * | 9/2014 | Motz ......................... | H03F 3/38 330/9 |
| 11,867,773 B2 * | 1/2024 | Basu ................... | G01R 33/0029 |
| 2010/0066444 A1 | 3/2010 | Chen et al. | |

FOREIGN PATENT DOCUMENTS

| | | |
|---|---|---|
| JP | 2016-127422 A | 7/2016 |
| JP | 2016-225896 A | 12/2016 |

(Continued)

OTHER PUBLICATIONS

International Search Report and Written Opinion of PCT Application No. PCT/JP2021/025552, issued on Sep. 7, 2021, 11 pages of ISRWO.

*Primary Examiner* — Hieu P Nguyen
(74) *Attorney, Agent, or Firm* — CHIP LAW GROUP

(57) ABSTRACT

Provided is a semiconductor circuit that includes a plurality of amplifiers that is connected in series and individually amplify and supply a signal on an input side to an output side. A first chopper switch is connected to an input side of a first amplifier connected first among the plurality of amplifies, and a second chopper switch is connected to an output side of the first amplifier. The first and second chopper switches act in synchronism with a first chopper clock. A third chopper switch is connected to an input side of a second amplifier, and a fourth chopper switch is connected to an output side of the second amplifier. The third and fourth chopper switches act in synchronism with a second chopper clock. A phase compensation capacitor is connected at one end to an input portion of the third chopper switch.

12 Claims, 24 Drawing Sheets

(51) Int. Cl.
　　　*H03F 3/00*　　　　　(2006.01)
　　　*H03F 3/45*　　　　　(2006.01)
(58) Field of Classification Search
　　　USPC ............................................. 330/252–261, 9
　　　See application file for complete search history.

(56)　　　　　　　　References Cited

FOREIGN PATENT DOCUMENTS

| JP | 2019-165298 | A | 9/2019 |
| JP | 2020-145545 | A | 9/2020 |
| WO | 2010/016167 | A1 | 2/2010 |

* cited by examiner

F I G . 3
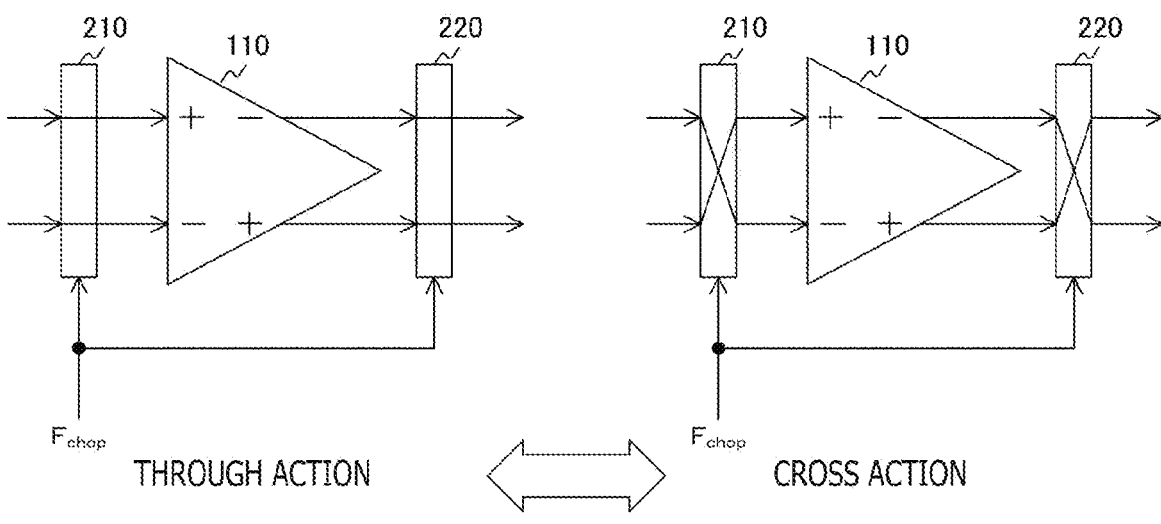
THROUGH ACTION ⟷ CROSS ACTION
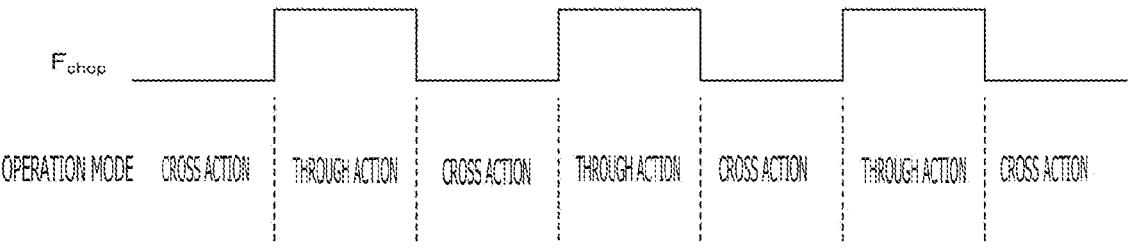

F I G . 1 9
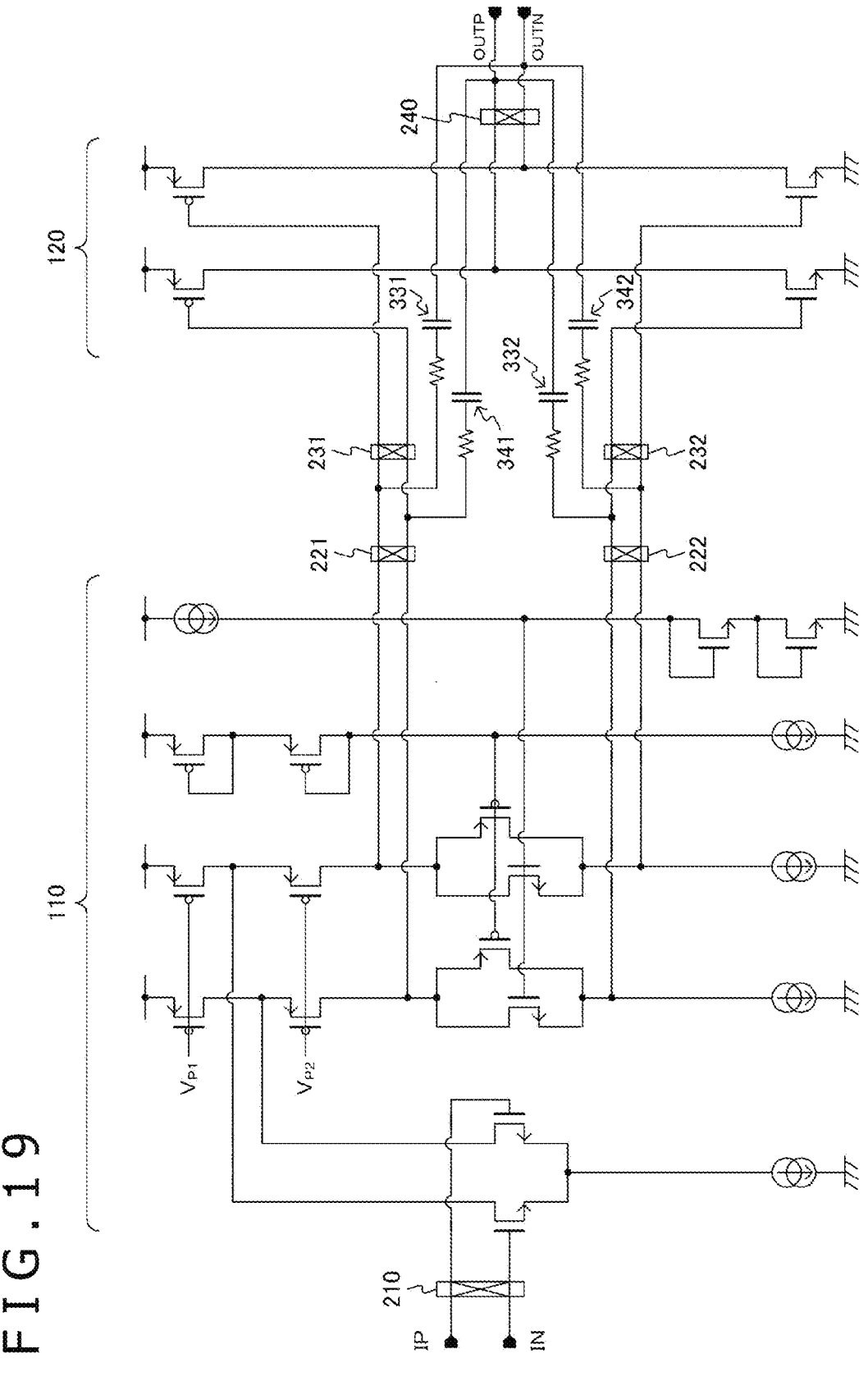

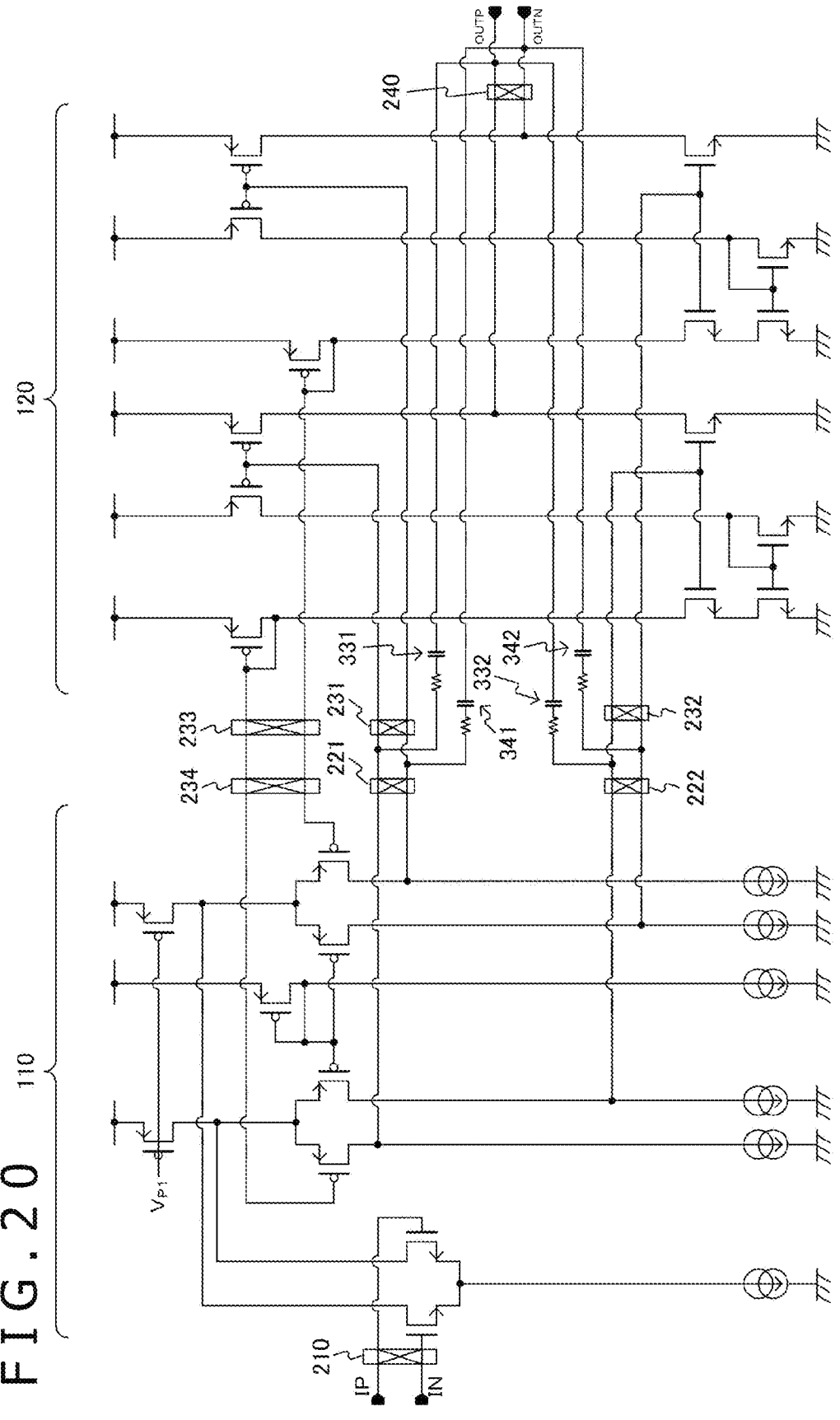
F I G . 2 0

F I G . 2 4

SEMICONDUCTOR CIRCUIT

CROSS REFERENCE TO RELATED APPLICATIONS

This application is a U.S. National Phase of International Patent Application No. PCT/JP2021/025552 filed on Jul. 7, 2021, which claims priority benefit of Japanese Patent Application No. JP 2020-146748 filed in the Japan Patent Office on Sep. 1, 2020. Each of the above-referenced applications is hereby incorporated herein by reference in its entirety.

TECHNICAL FIELD

The present technology relates to a semiconductor circuit. Particularly, the present technology relates to a semiconductor circuit in which a chopper switch is connected to an amplifier.

BACKGROUND ART

In an application for which low noise is required in a low frequency region, it is typical that a chopper switch is applied to an amplifier. In such an amplifier as just described, depending upon a usage, a one-stage configuration sometimes fails to achieve a desired characteristic due to insufficiency in DC gain, and therefore, it is necessary to use a multistage configuration that includes two or more stage amplifiers. In this case, if a chopper switch is connected to the outside of the multistage configuration and a capacitor is connected in the inside of the multistage configuration, the capacitor is seen as a load from a node inverted by the chopper switch on the input side, resulting in delay of the voltage settling by the inversion. Therefore, the output voltage waveform indicates a glitch of the chopper cycle and a settling waveform that is long from the glitch. Further, the open loop gain characteristic of the amplifier is deteriorated. Accordingly, in a conventional amplifier of the multistage configuration, it is typical that a chopper switch is connected to the amplifier only in the first stage (for example, see PTL 1.).

CITATION LIST

Patent Literature

PTL 1

Japanese Patent Laid-Open No. 2019-165298

SUMMARY

Technical Problems

In the conventional art described above, by connecting a chopper switch to the amplifier only in the first stage, inversion of the load node of the capacitor is avoided also by a chopping action to avoid deterioration of settling and an alternate current characteristic. However, in this case, since flicker noise of the amplifier in the second stage is not modulated into noise in a high frequency region by the chopper switch, the conventional art has a problem that it is not suitable for an application usage for which low noise is required in a low frequency region.

The present technology has been devised in view of the above circumstances, and it is an object of the present technology to appropriately connect a chopper switch to multistage amplifiers.

Solution to Problems

The present technology has been devised in order to solve the problem described above, and according to a first aspect of the present technology, there is provided a semiconductor circuit including a plurality of amplifiers that is connected in series and individually amplify and supply a signal on an input side thereof to an output side thereof, first and second chopper switches that are connected to an input side and an output side of a first amplifier connected first among the plurality of amplifiers, respectively, to act in synchronism with a first chopper clock, third and fourth chopper switches that are connected to an input side and an output side of a second amplifier connected second or later among the plurality of amplifiers, respectively, to act in synchronism with a second chopper clock, and a phase compensation capacitor connected at one end thereof to an input portion of the third chopper switch. This brings about an effect that, in the semiconductor circuit including the plurality of amplifiers, while an influence of the phase compensation capacitor is avoided, the third and fourth chopper switches are connected to the input side and the output side of the second amplifier connected second or later.

Further, in the first aspect, the phase compensation capacitor may be connected at the other end thereof to a stage later than an output portion of the fourth chopper switch by mirror connection. This brings about an effect that the capacitance value is increased effectively.

Alternatively, in the first aspect, the phase compensation capacitor may be connected at the other end thereof to a power supply potential or a ground potential. This brings about an effect that the power supply rejection ratio is improved.

Further, in the first aspect, the first and second chopper clocks may be the same signal. This brings about an effect that the first to fourth chopper switches act in synchronism with each other.

Further, in the first aspect, the second chopper clock may be delayed for a predetermined period of time from the first chopper clock. This brings about an effect that the timing at which a glitch appears is dispersed and the peak value of the glitch is suppressed. In this case, the semiconductor circuit may further include a delay circuit that delays the first chopper clock for the predetermined period of time to generate the second chopper clock.

Further, in the first aspect, the first and second chopper clocks may have frequencies different from each other. This brings about an effect that the first and second chopper switches and the third and fourth chopper switches act at timings different from each other. In this case, the semiconductor circuit may further include a frequency divider that generates, from one of the first and second chopper clocks, the other of the first and second chopper clocks.

Further, in the first aspect, the semiconductor circuit may further include a phase synchronization circuit that generates a reference signal, and a frequency divider that generates the first and second chopper clocks on the basis of the reference signal.

Further, in the first aspect, the semiconductor circuit may be configured such that the plurality of amplifiers is each a differential-input and differential-output fully differential amplifier, each of the first to fourth chopper switches performs switching between an action for passing differential input signals therethrough and another action for crossing the differential input signals in synchronism with the first or the second chopper clock and outputs resulting signals as differential output signals, and the phase compensation capacitor is connected to each of differential input portions of the third chopper switch. In this case, the plurality of amplifiers may each be a translinear loop type fully differential amplifier or may each be a minimum selector type fully differential amplifier.

BRIEF DESCRIPTION OF DRAWINGS

FIG. 3 is a diagram depicting an example of an action of the chopper switch 210 in the embodiment of the present technology.

FIG. 19 is a diagram depicting an example of a case in which the semiconductor circuit 100 according to the embodiment of the present technology is applied as a translinear loop type fully differential amplifier.

FIG. 20 is a diagram depicting an example of a case in which the semiconductor circuit 100 according to the embodiment of the present technology is applied as a minimum selector type fully differential amplifier.

FIG. 24 is a diagram depicting an example of application of the semiconductor circuit 100 according to the embodiment of the present technology to an analog front end circuit of a biosensor.

DESCRIPTION OF EMBODIMENT

In the following, a mode for carrying out the present technology (hereinafter referred to as an embodiment) is described. The description is given in the following order.

1. Embodiment
2. Example of Application

1. EMBODIMENT

First Example of Circuit

Figure 1:
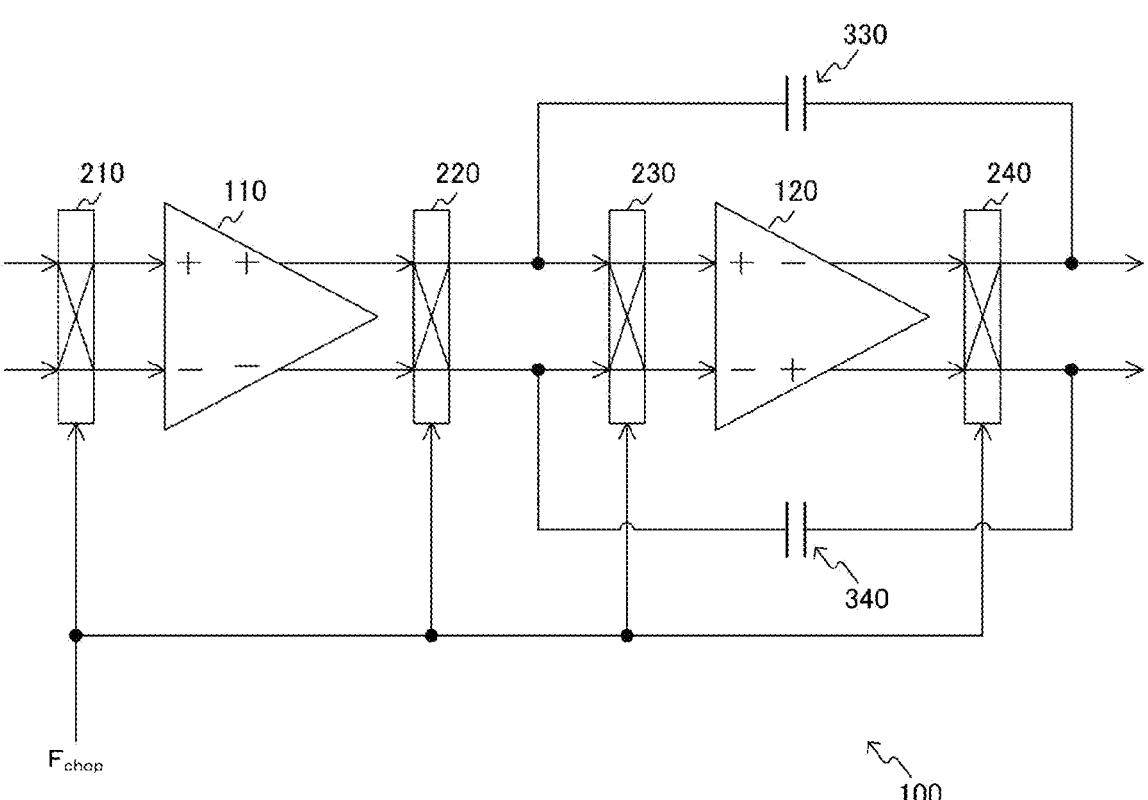
FIG. 1 is a diagram depicting a first example of a semiconductor circuit 100 according to an embodiment of the present technology.

FIG. 1 is a diagram depicting a first example of a semiconductor circuit 100 according to the embodiment of the present technology.

The first example of the semiconductor circuit 100 is a circuit in which two stage amplifiers 110 and 120 are connected in series. Each of the amplifiers 110 and 120 is a fully differential amplifier that amplifies differential signals inputted thereto and outputs resulting differential signals.

Chopper switches 210 and 220 are connected to the input side and the output side of the amplifier 110, respectively. Chopper switches 230 and 240 are connected to the input side and the output side of the amplifier 120, respectively. In present first example, the chopper switches 210, 220, 230, and 240 act according to a common chopper clock of a fixed frequency Fchop.

Between the input portion of the chopper switch 230 and the output portion of the chopper switch 240, phase compensation capacitors 330 and 340 are connected by mirror connection. The phase compensation capacitors 330 and 340 are capacitors for allowing the amplifiers 110 and 120 to secure a phase margin to avoid unintended oscillation of them.

From the output side of the amplifier 110, the phase compensation capacitors 330 and 340 are seen through the chopper switch 220. However, since the output portion of the chopper switch 220 is not inverted by chopping, the amplifier 110 need not charge the phase compensation capacitors 330 and 340 by chopping inversion. Therefore, such a phenomenon that settling is not performed in time due to insufficiency in driving capacity of the amplifier 110 does not occur. Accordingly, it is sufficient if the amplifier 110 has such a degree of driving capacity that it follows up an input signal thereto.

Similarly, from the output side of the amplifier 120, the phase compensation capacitors 330 and 340 and a load capacitance not depicted are seen through the chopper switch 240. However, since the output portion of the chopper switch 240 is not inverted by chopping, the amplifier 120 need not charge the phase compensation capacitors 330 and 340 by chopping inversion. Therefore, such a phenomenon that settling is not performed in time due to insufficiency in driving capacity of the amplifier 120 does not occur. Accordingly, it is sufficient if also the amplifier 120 has such a degree of driving capacity that it follows up an input signal thereto.

Figure 2:
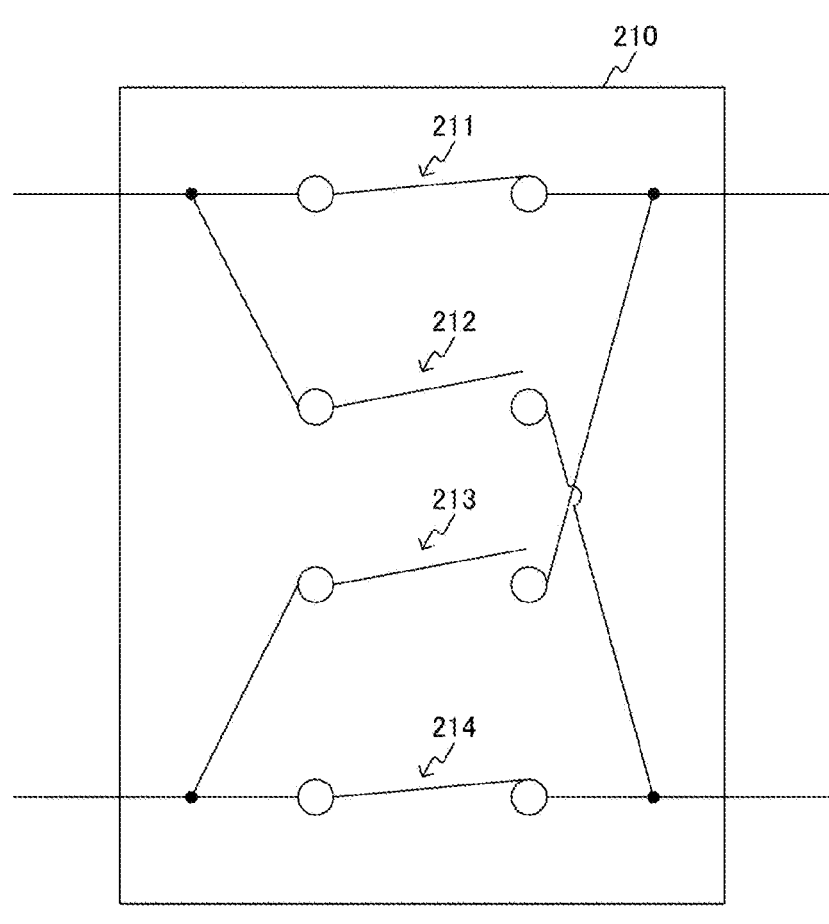
FIG. 2 is a diagram depicting an example of a configuration of a chopper switch 210 in the embodiment of the present technology.

FIG. 2 is a diagram depicting an example of a configuration of the chopper switch 210 in the embodiment of the present technology. It is to be noted that, although the following description is given taking the chopper switch 210 as an example, also the other chopper switches 220, 230, and 240 have a similar configuration.

The chopper switch 210 includes four switches 211 to 214 that are switched on or off according to a chopper clock. The switches 211 and 214 perform the same action in synchronism with each other, and also the switches 212 and 213 perform the same action in synchronism with each other. However, the action of the switches 211 and 214 and the action of the choppers 212 and 213 are reverse actions to each other. In particular, while the switches 211 and 214 perform an on action, the choppers 212 and 213 perform an off action, and while the switches 211 and 214 perform an off action, the choppers 212 and 213 perform an on action. Consequently, the chopper switch 210 as a whole repeats such a through action and a cross action as described below.

FIG. 3 is a diagram depicting an example of an action of the chopper switch 210 in the embodiment of the present technology.

When the switches 211 and 214 perform an on action and the choppers 212 and 213 perform an off action, the action of the chopper switch 210 is a through action by which differential input signals thereto are passed therethrough. On the other hand, when the switches 211 and 214 perform an off action and the choppers 212 and 213 perform an on action, the action of the chopper switch 210 is a cross action by which differential input signals thereto are crossed.

Since a common chopper clock is inputted to the chopper switches 210 and 220, the chopper switches 210 and 220 perform the same action on the input side and the output side of the amplifier 110. Accordingly, the polarities of the input and the output are not changed by the chopper switches 210 and 220.

The chopper clock indicates repetitions of the high level and the low level in the frequency Fchop, and, for example, if the chopper clock has the high level, then the chopper switches 210 and 220 perform a through action. On the other hand, if the chopper clock has the low level, then the chopper switches 210 and 220 perform a cross action.

Figure 4A:
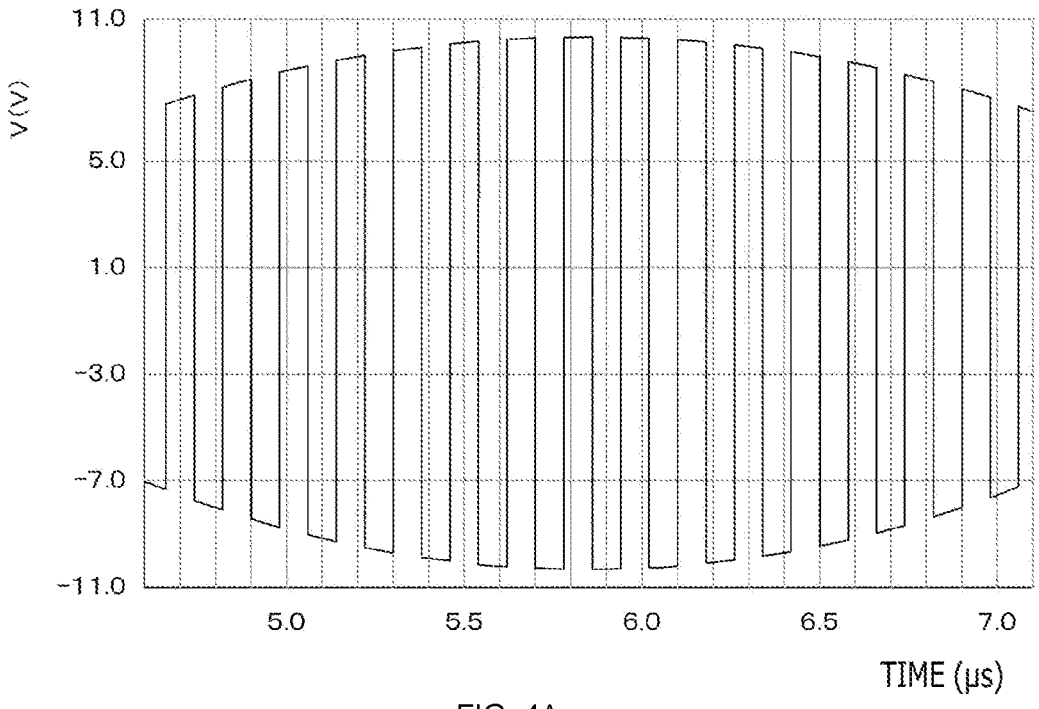
FIGS. 4A and 4B depict diagrams each depicting an example of a voltage waveform of a chopper switch 240 in the embodiment of the present technology.
Figure 4B:
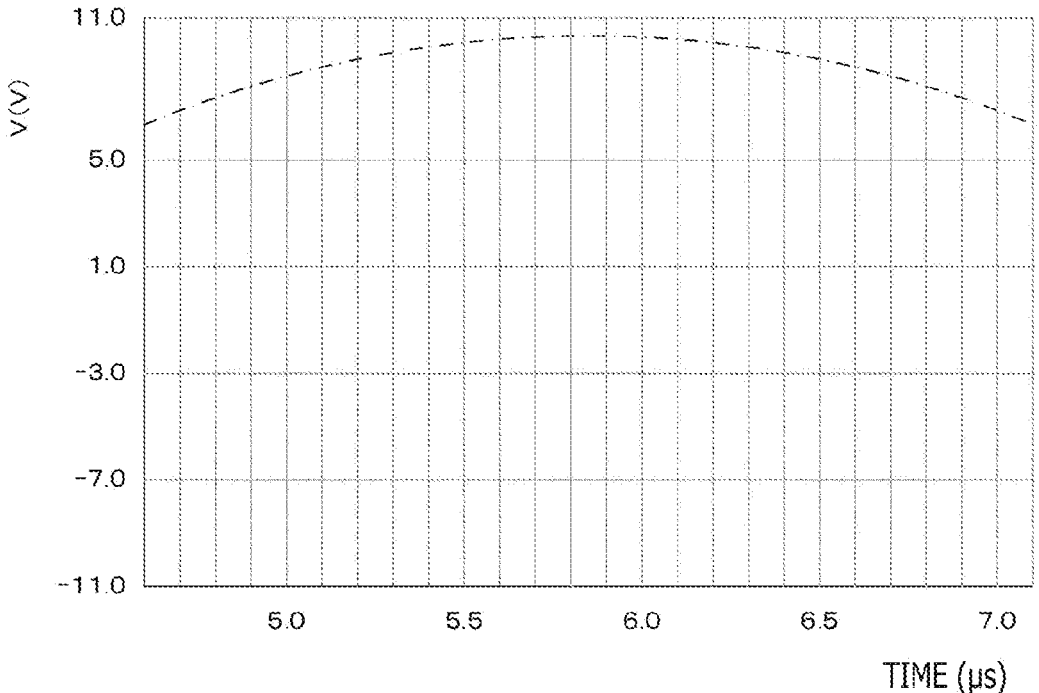

FIGS. 4A and 4B depict diagrams each depicting an example of a voltage waveform of the chopper switch 240 in the embodiment of the present technology.

By an action of the chopper switch 240, modulation is performed around the frequency Fchop. By modulating noise components around a direct current component at the frequency Fchop, a component Δf of flicker noise is converted into "Fchop+Δf" in a high frequency region. At this time, by configuring a low-pass filter, the flicker noise component converted to that in the high frequency region can be cut.

In the present embodiment, since the nodes to which the phase compensation capacitors 330 and 340 are connected are not inverted in voltage polarity by chopping as described above, the necessity for performing charging and discharging for the phase compensation capacitors 330 and 340 from the outputs of the amplifiers 110 and 120 is eliminated. As a result, since the phase compensation capacitors 330 and 340 are not effectively seen as a load from the output side of the amplifiers 110 and 120, little rounding occurs with the waveform of settling of the amplifier 120 as indicated by FIG. 4A. Accordingly, as depicted in FIG. 4B, a glitch by chopping does not appear but a nice envelope appears at the output portion of the chopper switch 240.

Second Example of Circuit

Figure 5:
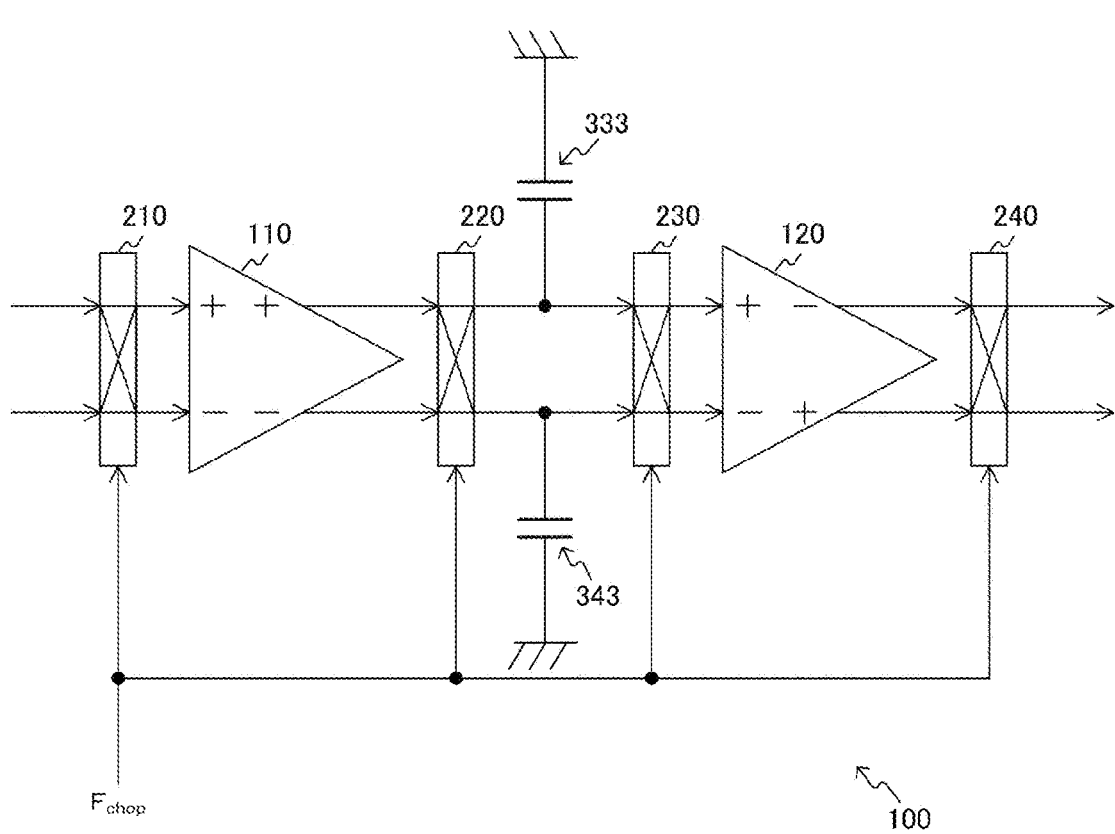
FIG. 5 is a diagram depicting a second example of the semiconductor circuit 100 according to the embodiment of the present technology.

FIG. 5 is a diagram depicting a second example of the semiconductor circuit 100 according to the embodiment of the present technology.

The present second example of the semiconductor circuit 100 is a circuit in which two stage amplifiers 110 and 120 are connected in series similarly as in the first example described hereinabove. Although, in the first example described above, the phase compensation capacitors 330 and 340 are connected by mirror connection, in the present second example, a phase compensation capacitor 333 is connected to the power supply potential and another phase compensation capacitor 334 is connected to the ground potential.

Although the mirror connection described above is advantageous in that the capacitance value can be increased effectively and the stability of the amplifiers can be secured with a small area, it has a problem that the PSRR (Power Supply Rejection Ratio) is deteriorated. In contrast, with such a common connection as in the second example, the PSRR can be improved. Which one of the mirror connection and the common connection is to be adopted is selected, depending upon the tradeoff for each circuit.

Also in the present second example, since the phase compensation capacitors 330 and 340 are not seen as an effective load from the output side of the amplifiers 110 and 120, the settling waveform is not rounded, and a glitch by chopping does not appear, similarly as in the first example described above.

Third Example of Circuit

Figure 6:
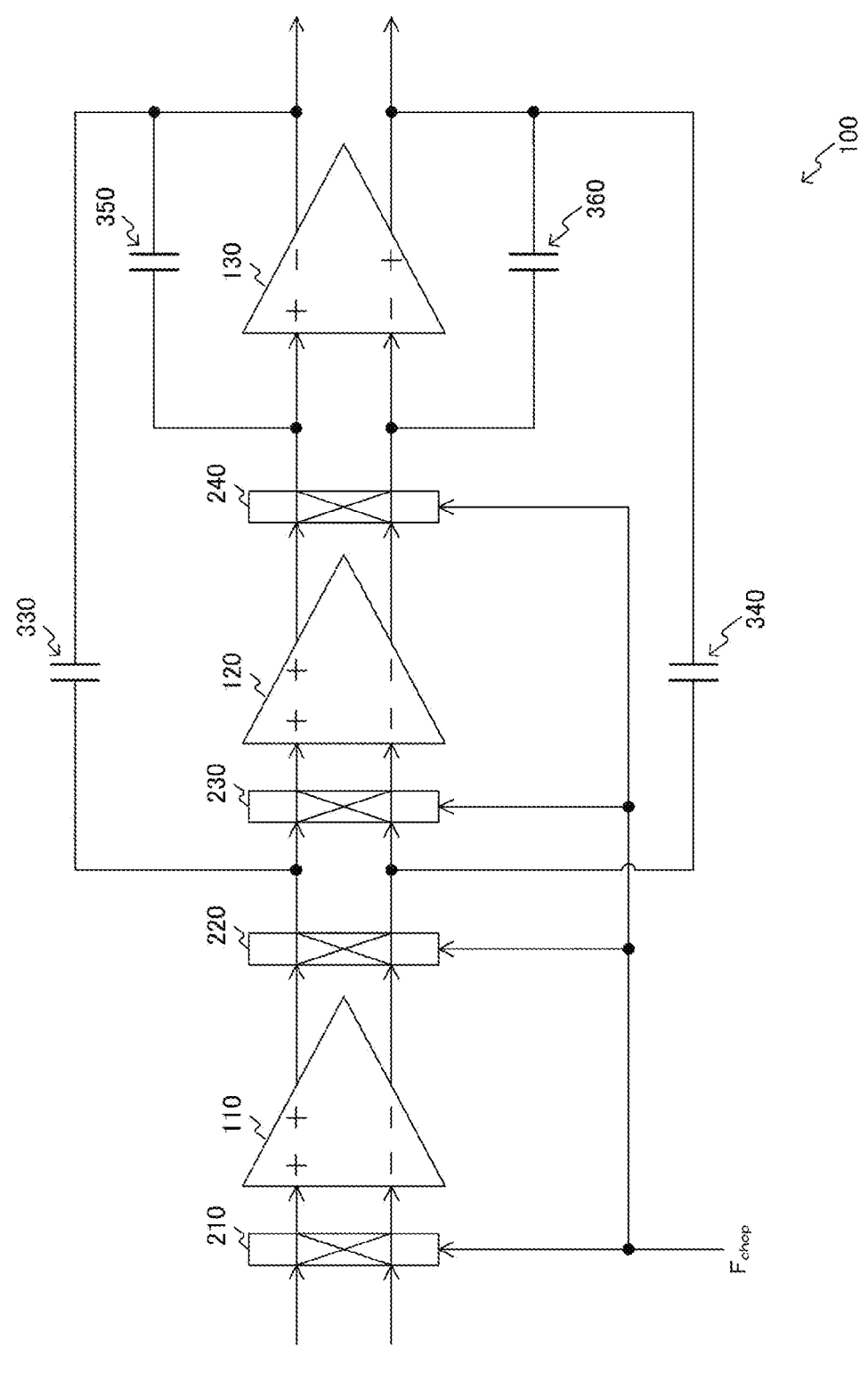
FIG. 6 is a diagram depicting a third example of the semiconductor circuit 100 according to the embodiment of the present technology.

FIG. 6 is a diagram depicting a third example of the semiconductor circuit 100 according to the embodiment of the present technology.

The present third example of the semiconductor circuit 100 is a circuit in which three stage amplifiers 110, 120, and 130 are connected in series. Each of the amplifiers 110, 120, and 130 is a fully differential amplifier that amplifies differential signals as an input thereto and outputs the amplified differential signals.

Chopper switches 210 and 220 are connected to the input side and the output side of the amplifier 110, respectively. Chopper switches 230 and 240 are connected to the input side and the output side of the amplifier 120, respectively. In the present first example, the chopper switches 210, 220, 230, and 240 act according to a common chopper clock of a fixed frequency Fchop.

Between the input portion of the chopper switch 230 and the output side of the amplifier 130, phase compensation capacitors 330 and 340 are connected by mirror connection. Further, between the input side of the amplifier 130, phase compensation capacitors 350 and 360 are connected by mirror connection.

Also in the present third example, since the phase compensation capacitors 330, 340, 350, and 360 are not seen as an effective load from the output side of the amplifiers 110 and 120, the settling waveform is not rounded, and a glitch by chopping does not appear.

Fourth Example of Circuit

Figure 7:
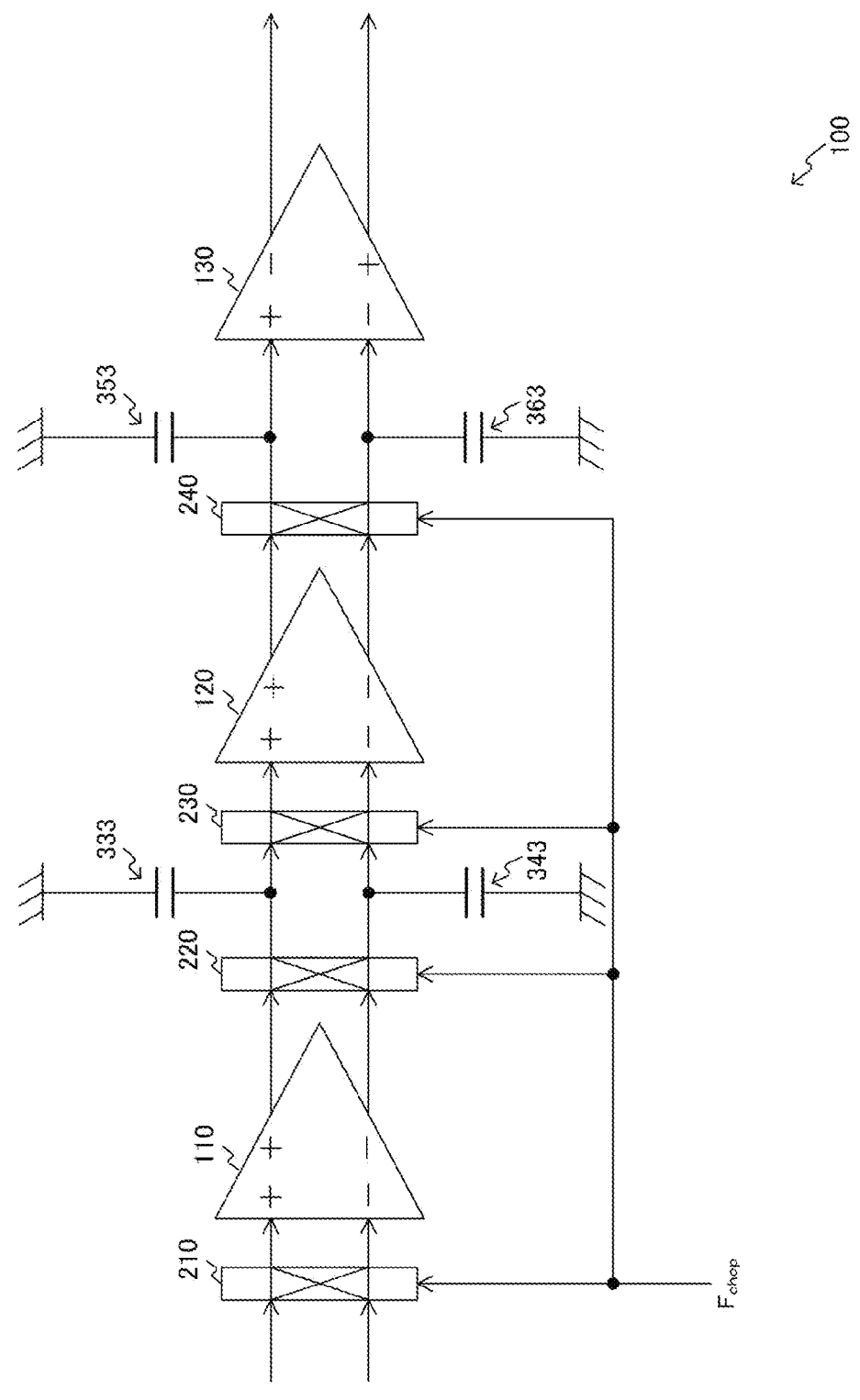
FIG. 7 is a diagram depicting a fourth example of the semiconductor circuit 100 according to the embodiment of the present technology.

FIG. 7 is a diagram depicting a fourth example of the semiconductor circuit 100 according to the embodiment of the present technology.

The present fourth example of the semiconductor circuit 100 is a circuit in which three stage amplifiers 110, 120, and 130 are connected in series similarly as in the third example described hereinabove. Although, in the third example described above, the phase compensation capacitors 330 and 340 and the phase compensation capacitors 350 and 360 are individually connected by mirror connection, in the present fourth example, phase compensation capacitors 333 and 353 are connected to the power supply potential, and phase compensation capacitors 334 and 363 are connected to the ground potential.

Also in the present fourth example, since the phase compensation capacitors 333, 343, 353, and 363 are not seen as an effective load from the output side of the amplifiers 110 and 120, the settling waveform is not rounded, and a glitch by chopping does not appear.

Fifth Example of Circuit

Figure 8:
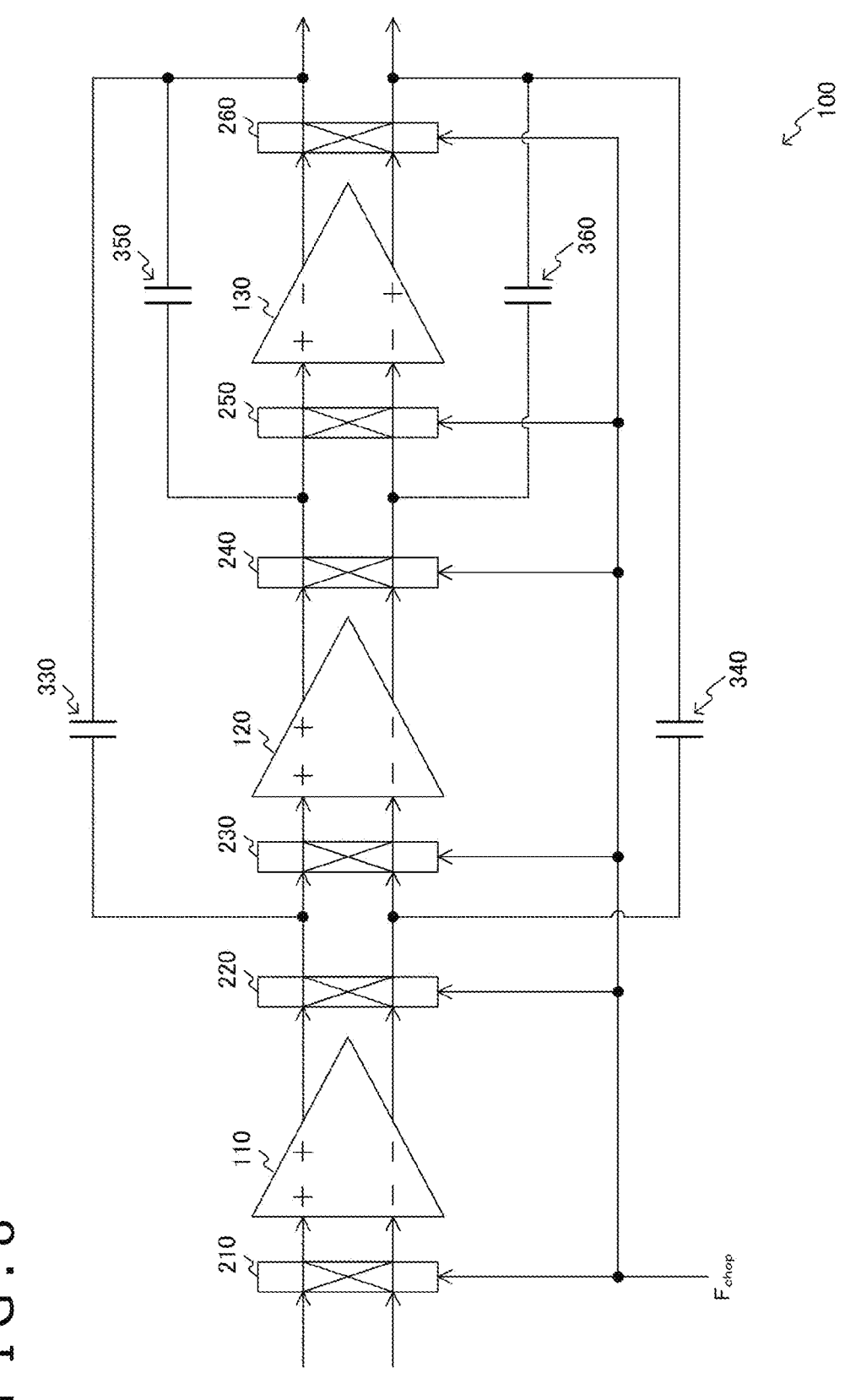
FIG. 8 is a diagram depicting a fifth example of the semiconductor circuit 100 according to the embodiment of the present technology.

FIG. 8 is a diagram depicting a fifth example of the semiconductor circuit 100 according to the embodiment of the present technology.

The present fifth example of the semiconductor circuit 100 is a circuit in which three stage amplifiers 110, 120, and 130 are connected in series similarly as in the third example described hereinabove.

Chopper switches 210 and 220 are connected to the input side and the output side of the amplifier 110, respectively. Chopper switches 230 and 240 are connected to the input side and the output side of the amplifier 120, respectively. Chopper switches 250 and 260 are connected to the input side and the output side of the amplifier 130, respectively. In the present fifth example, the chopper switches 210, 220, 230, 240, 250, and 260 act according to a common chopper clock of a predetermined frequency Fchop.

Between the input portion of the chopper switch 230 and the output portion of the chopper switch 260, phase compensation capacitors 330 and 340 are connected by mirror connection. Further, between the input portion of the chopper switch 250 and the output portion of the chopper switch 260, phase compensation capacitors 350 and 360 are connected by mirror connection.

Also in the present fifth example, since the phase compensation capacitors 330, 340, 350, and 360 are not seen as an effective load from the output side of the amplifiers 110, 120, and 130, the settling waveform is not rounded, and a glitch by chopping does not appear.

Sixth Example of Circuit

Figure 9:
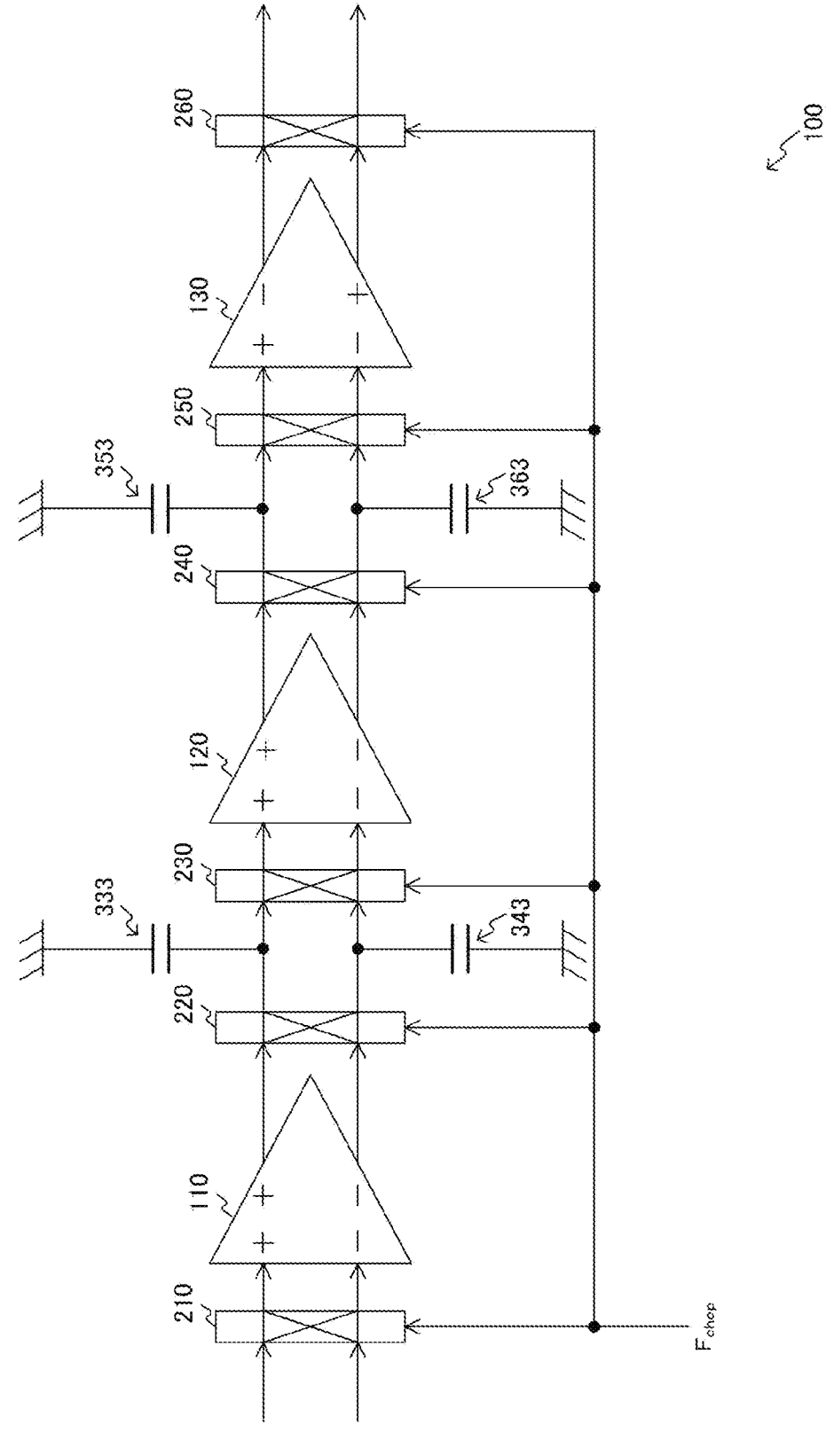
FIG. 9 is a diagram depicting a sixth example of the semiconductor circuit 100 according to the embodiment of the present technology.

FIG. 9 is a diagram depicting a sixth example of the semiconductor circuit 100 according to the embodiment of the present technology.

The present sixth example of the semiconductor circuit 100 is a circuit in which three stage amplifiers 110, 120, and 130 are connected in series similarly as in the fifth example described above. Although, in the fifth example described above, the phase compensation capacitors 330 and 340 and the phase compensation capacitors 350 and 360 are connected by mirror connection, in the present sixth example, the phase compensation capacitors 333 and 353 are connected to the power supply potential and the phase compensation capacitors 334 and 363 are connected to the ground potential.

Also in the present sixth example, since the phase compensation capacitors 330, 340, 350, and 360 are not seen as an effective load from the output side of the amplifiers 110, 120, and 130, the settling waveform is not rounded and a glitch by chopping does not appear.

Skew of Chopper Clock

Figure 10A:
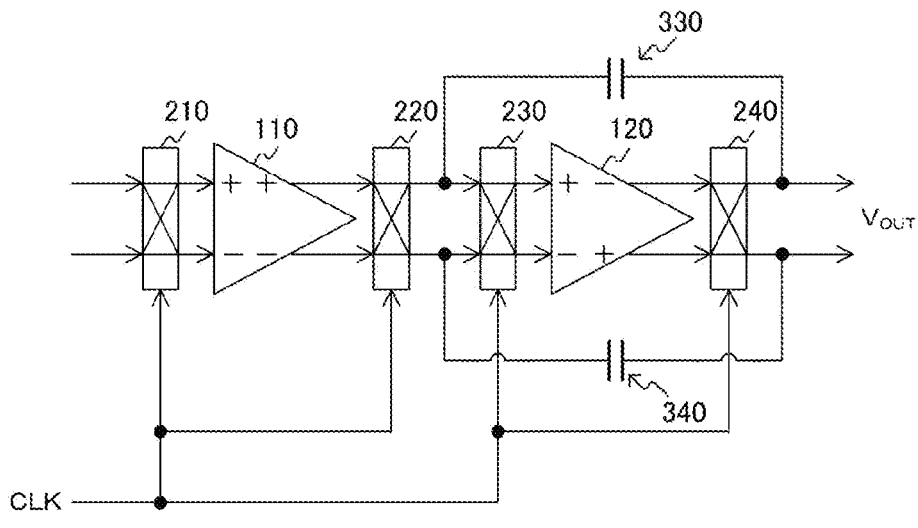
FIGS. 10A and 10B depict diagrams each depicting an example of a case in which a common chopper clock is used for all chopper switches in the embodiment of the present technology.
Figure 10B:
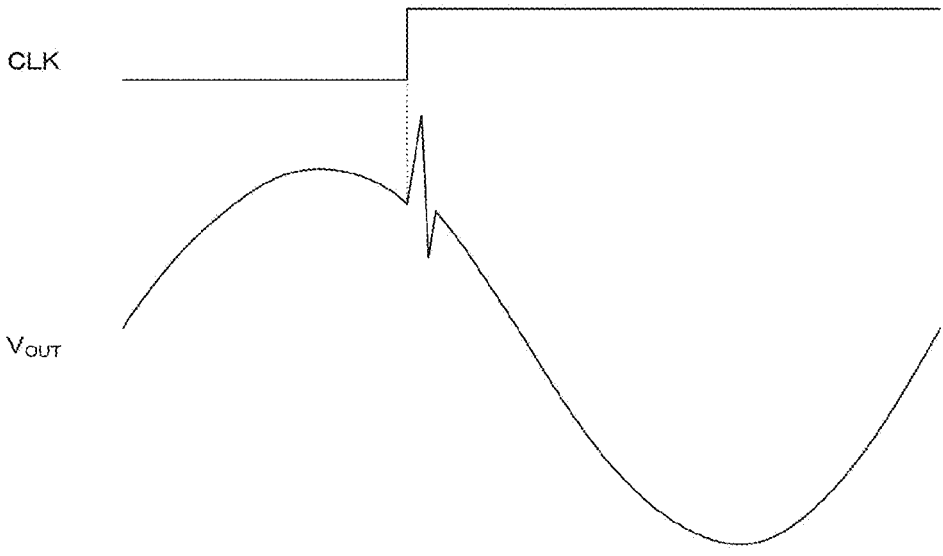

FIGS. 10A and 10B are diagrams depicting an example of a case in which a common chopper clock is used by all chopper switches in the embodiment of the present technology.

In the examples of the semiconductor circuit 100 described above, it is assumed that all chopper switches act according to a common chopper clock as depicted in FIG. 10A. In this case, there is the possibility that the output voltage VOUT of the semiconductor circuit 100 may suffer from a glitch upon transition of the chopper clock as depicted in FIG. 10B. This glitch arises from clock field-through and charge injection.

Figure 11A:
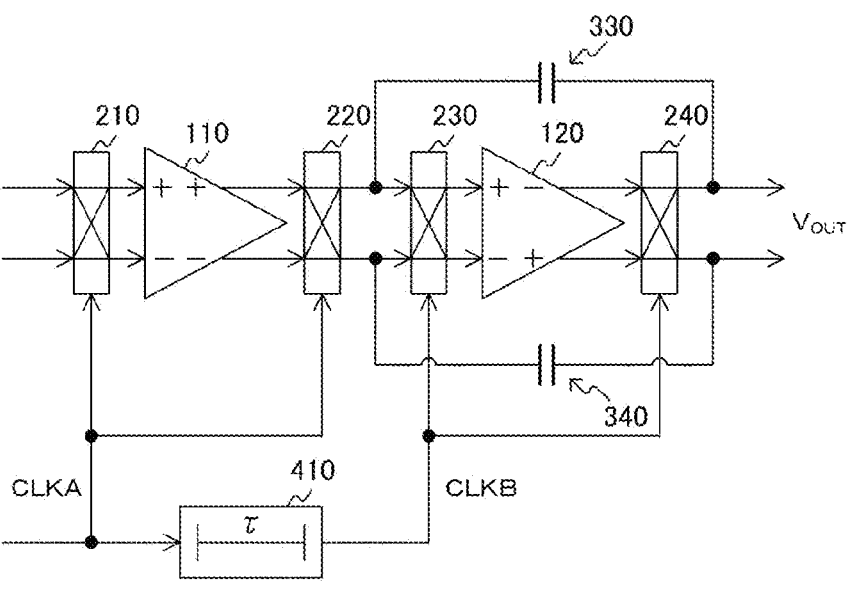
FIGS. 11A and 11B are diagrams depicting an example of a case in which different chopper clocks are used for chopper switches 210 and 220 and chopper switches 230 and 240 in the embodiment of the present technology.
Figure 11B:
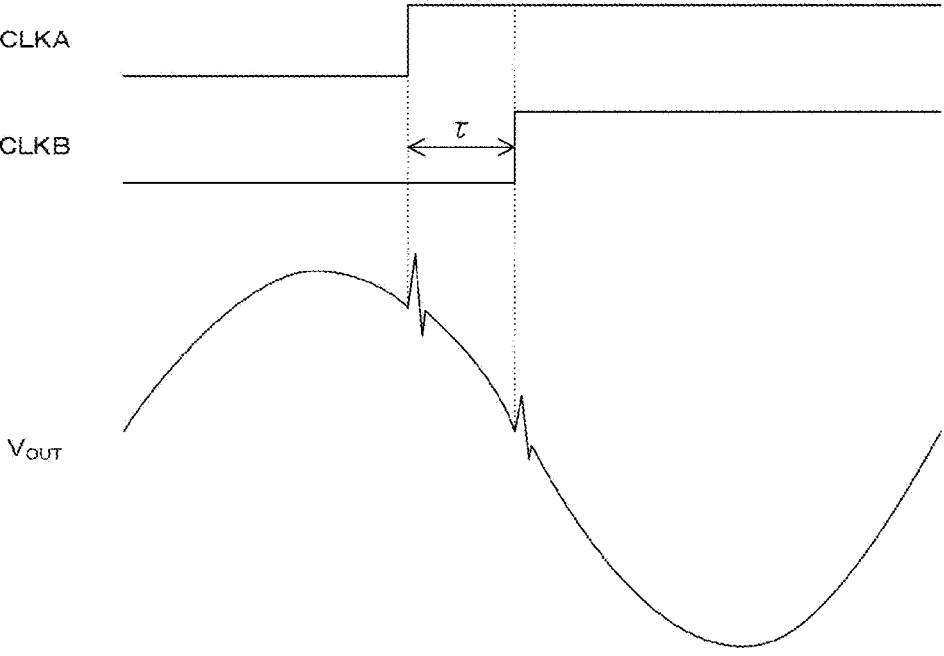

FIGS. 11A and 11B are diagrams depicting an example of a case in which chopper clocks different from each other are used by chopper switches 210 and 220 and chopper switches 230 and 240 in the embodiment of the present technology.

In the present example, a delay circuit 410 is provided as depicted in FIG. 11A. The present delay circuit 410 delays a chopper clock CLKA for the chopper switches 210 and 220 by a predetermined period of time T to generate a chopper clock CLKB for the chopper switches 230 and 240. Consequently, it is possible for the chopper switches 210 and 220 and the chopper switches 230 and 240 to provide a skew of the predetermined period of time τ at a timing at which the chopper clock is to transit thereby to disperse the timing at which a glitch appears and suppress the peak value of the glitch.

Supply of Chopper Clock

As described above, the chopper clock frequency can be changed in a unit of a chopper switch for each amplifier. In this case, as a method for clock supply to them, a plurality of chopper clocks may be supplied from a PLL (Phase Locked Loop) provided in a chip, or a plurality of chopper clocks may be supplied from the outside of a chip.

Figure 12:
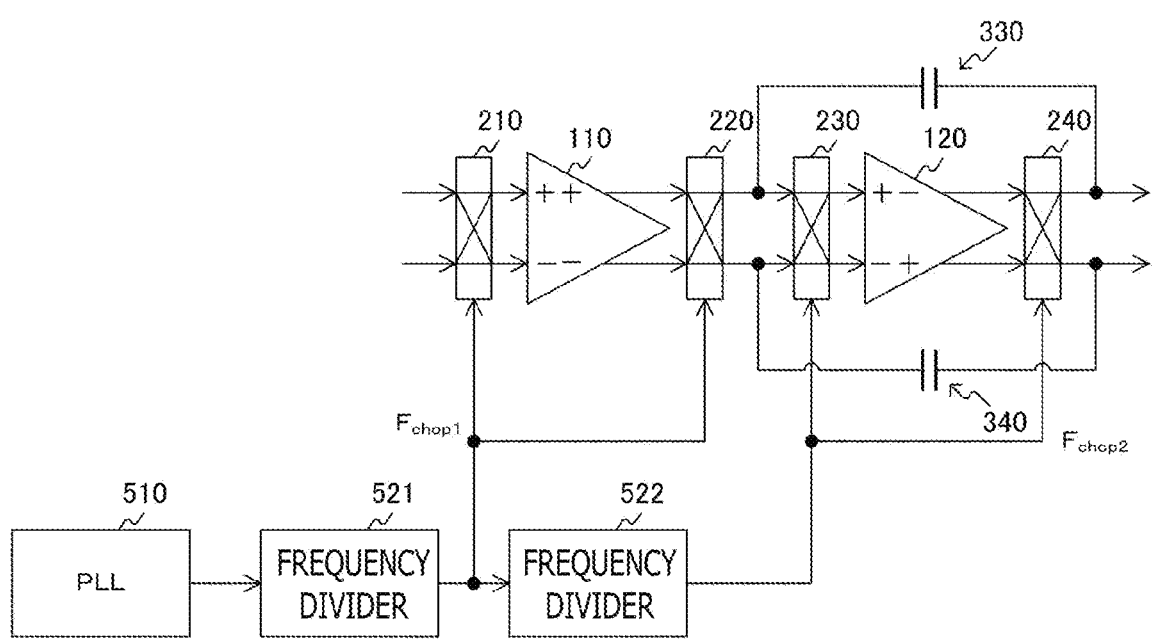
FIG. 12 is a diagram depicting a first example of chopper clock supply to the semiconductor circuit 100 according to the embodiment of the present technology.

FIG. 12 is a diagram depicting a first example of chopper clock supply to the semiconductor circuit 100 according to the embodiment of the present technology.

In the present first example of chopper clock supply, a PLL 510 is provided in a chip, and an output of the PLL 510 is used as a reference signal and divided by a frequency divider 521 to generate a first chopper clock (frequency Fchop1). Further, the first chopper clock is divided by another frequency divider 522 to generate a second chopper clock (frequency Fchop2). The first chopper clock is supplied to the chopper switches 210 and 220, and the second chopper clock is supplied to the chopper switches 230 and 240.

Figure 13:
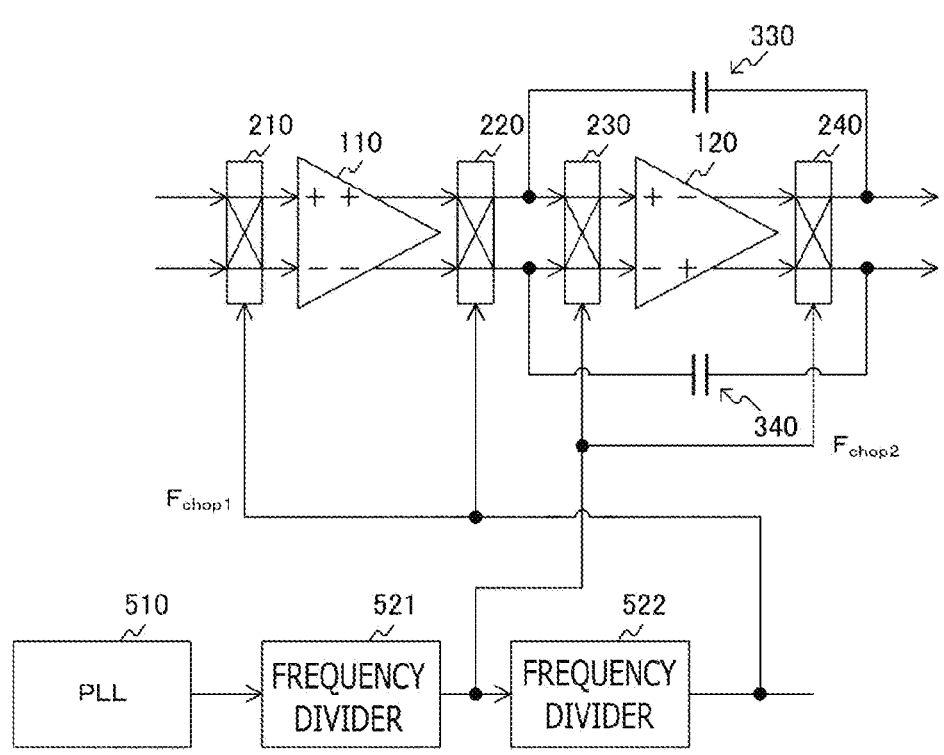
FIG. 13 is a diagram depicting a second example of chopper clock supply to the semiconductor circuit 100 according to the embodiment of the present technology.

FIG. 13 is a diagram depicting a second example of chopper clock supply to the semiconductor circuit 100 according to the embodiment of the present technology.

In the present second example of chopper clock supply, a PLL 510 is provided in a chip, and an output of the PLL 510 is used as a reference signal and divided by a frequency divider 521 to generate a second chopper clock (frequency Fchop2). Further, the second chopper clock is divided by another frequency divider 522 to generate a first chopper clock (frequency Fchop1). The first chopper clock is supplied to the chopper switches 210 and 220, and the second chopper clock is supplied to the chopper switches 230 and 240.

Figure 14:
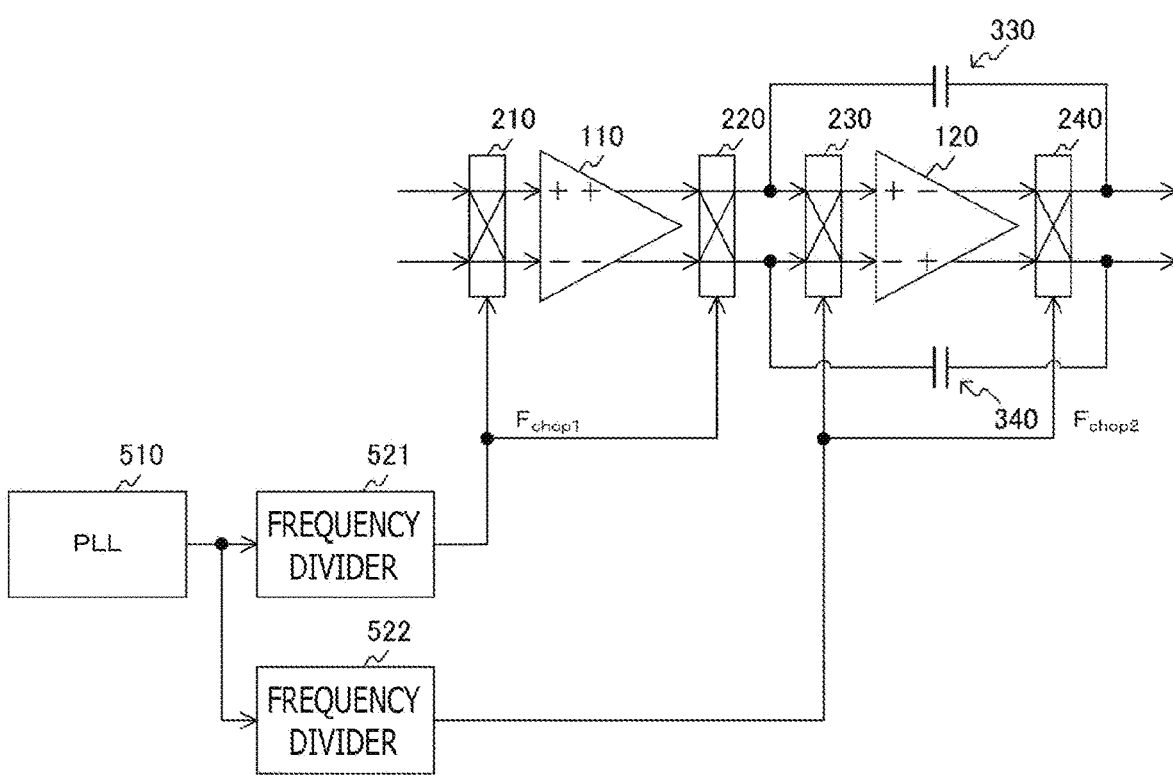
FIG. 14 is a diagram depicting a third example of chopper clock supply to the semiconductor circuit 100 according to the embodiment of the present technology.

FIG. 14 is a diagram depicting a third example of chopper clock supply to the semiconductor circuit 100 according to the embodiment of the present technology.

In the present third example of chopper clock supply, a PLL 510 is provided in a chip, and an output of the PLL 510 is used as a reference signal and divided by a frequency divider 521 to generate a first chopper clock (frequency Fchop1) and is divided by another frequency divider 522 to generate a second chopper clock (frequency Fchop2). The first chopper clock is supplied to the chopper switches 210 and 220, and the second chopper clock is supplied to the chopper switches 230 and 240.

Figure 15:
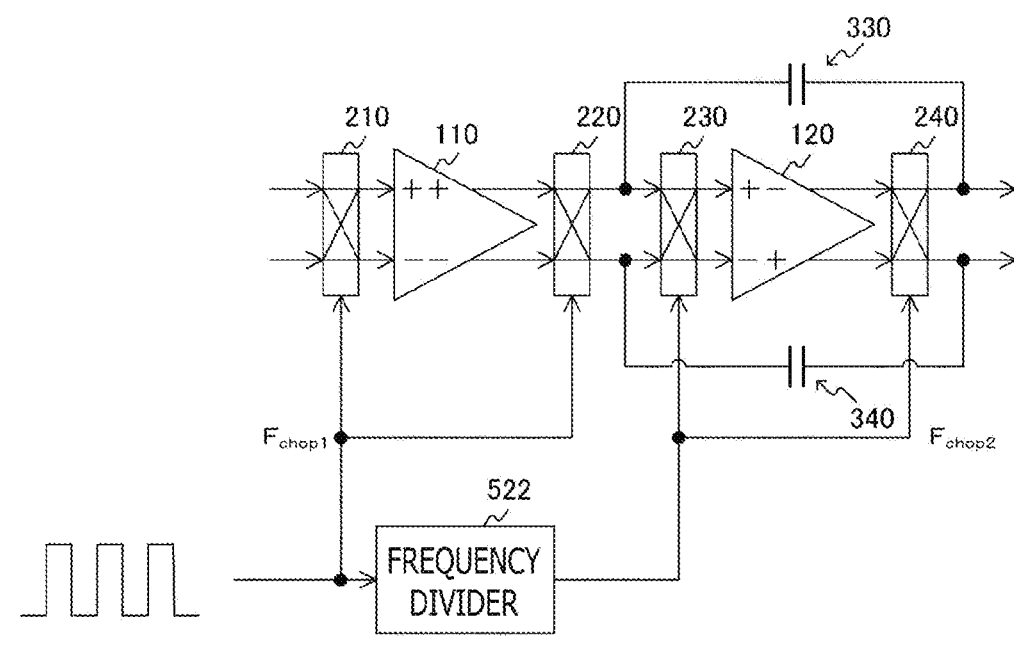
FIG. 15 is a diagram depicting a fourth example of chopper clock supply to the semiconductor circuit 100 according to the embodiment of the present technology.

FIG. 15 is a diagram depicting a fourth example of chopper clock supply to the semiconductor circuit 100 according to the embodiment of the present technology.

In the present fourth example of chopper clock supply, a clock supplied from the outside of a chip is supplied as a first chopper clock (frequency Fchop1) to the chopper switches 210 and 220. Further, the first chop clock is divided by a frequency divider 522 to generate a second chopper clock (frequency Fchop2). The second chopper clock is supplied to the chopper switches 230 and 240.

Figure 16:
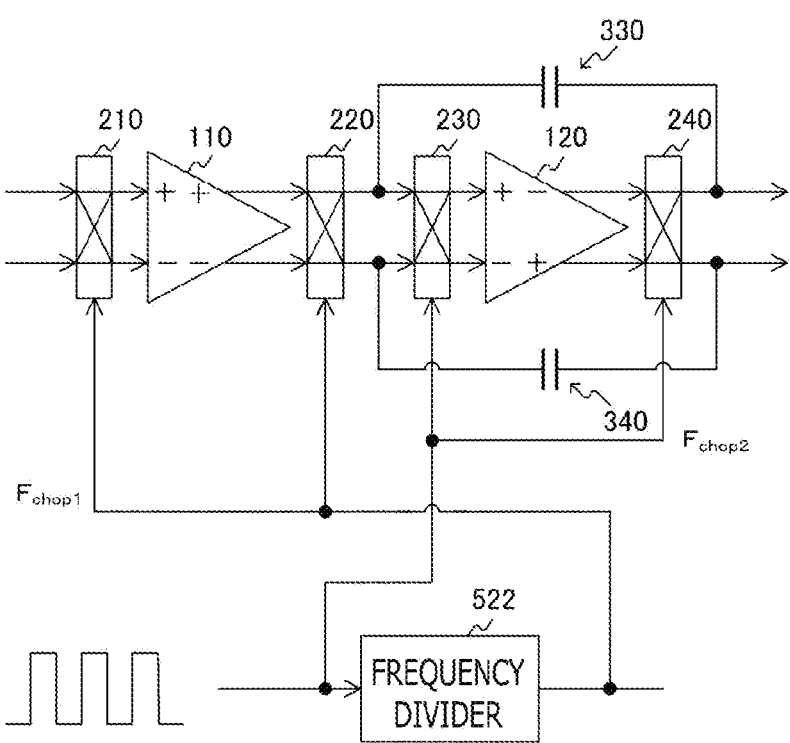
FIG. 16 is a diagram depicting a fifth example of chopper clock supply to the semiconductor circuit 100 according to the embodiment of the present technology.

FIG. 16 is a diagram depicting a fifth example of chopper clock supply to the semiconductor circuit 100 according to the embodiment of the present technology.

In the present fifth example of chopper clock supply, a clock supplied from the outside of a chip is supplied as a second chopper clock (frequency Fchop2) to chopper switches 230 and 240. Further, the second chopper clock is divided by a frequency divider 522 to generate a first chopper clock (frequency Fchop1). The first chopper clock is supplied to the chopper switches 210 and 220.

Figure 17:
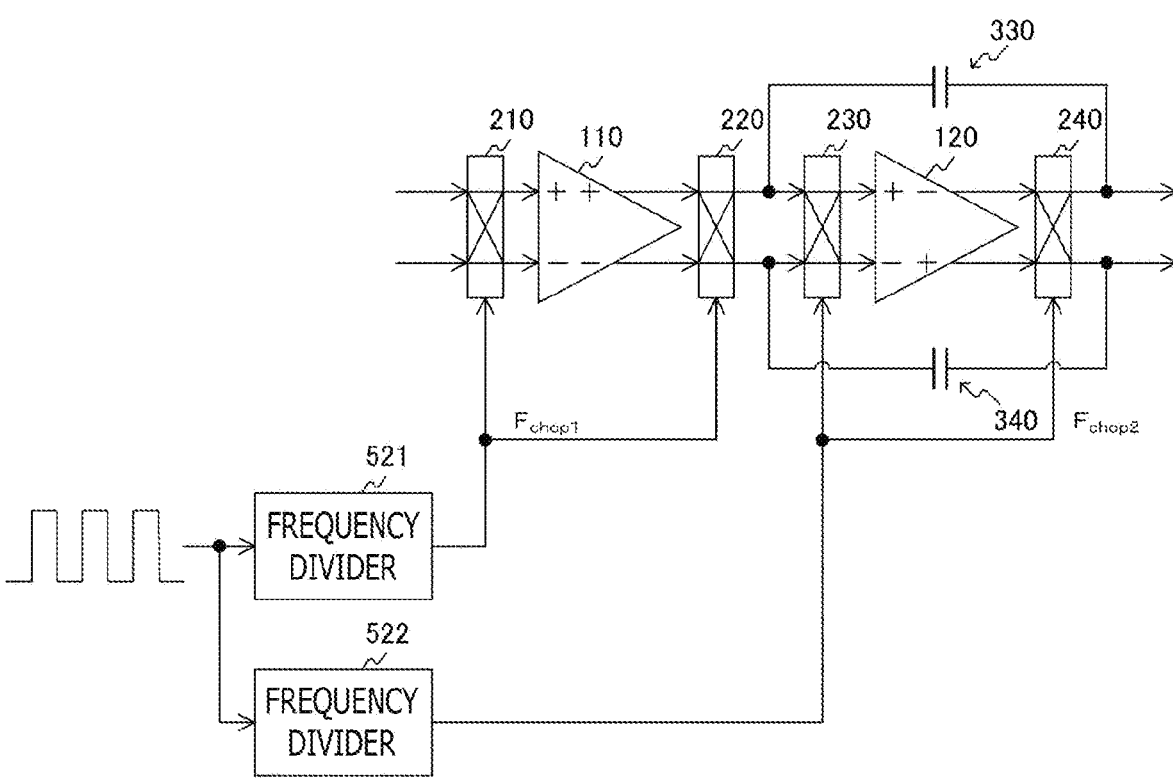
FIG. 17 is a diagram depicting a sixth example of chopper clock supply to the semiconductor circuit 100 according to the embodiment of the present technology.

FIG. 17 is a diagram depicting a sixth example of chopper clock supply to the semiconductor circuit 100 according to the embodiment of the present technology.

In the present sixth example of chopper clock supply, a clock supplied from the outside of a chip is divided by a frequency divider 521 to generate a first chopper clock (frequency Fchop1) and is divided by another frequency divider 522 to generate a second chopper clock (frequency Fchop2). The first chopper clock is supplied to the chopper switches 210 and 220 and the second chopper clock is supplied to the chopper switches 230 and 240.

Figure 18:
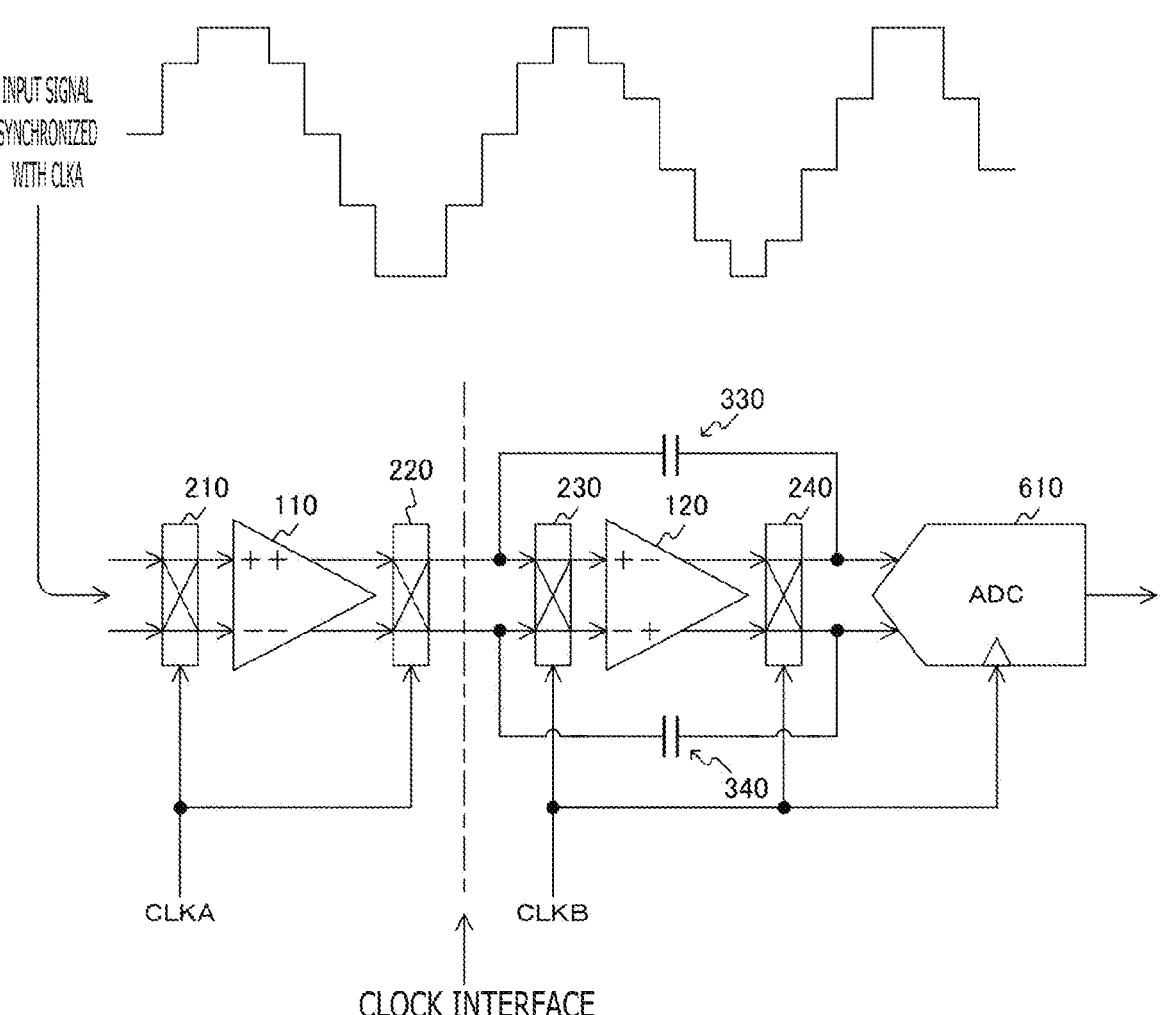
FIG. 18 is a diagram depicting an example of practical application of chopper clock supply to the semiconductor circuit 100 according to the embodiment of the present technology.

FIG. 18 is a diagram depicting an example of a practical application of chopper clock supply to the semiconductor circuit 100 according to the embodiment of the present technology.

By providing a plurality of chopper clocks in such a manner as described above, a plurality of amplifiers can act with clocks different from one another. For example, a case is supposed in which, as depicted in FIG. 18, while a signal synchronized with a chopper clock CLKA for the chopper switches 210 and 220 on the input and output sides of the amplifier 110 is inputted, an ADC (Analog-to-Digital Converter: AD converter) 610 in the succeeding stage acts with a different frequency. In this case, a clock interface can be provided by using the chopper clock CLKB for the chopper switches 230 and 240 on the input and output sides of the amplifier 120 as a clock common to the clock to the ADC 610.

Translinear Loop Type Fully Differential Amplifier

FIG. 19 is a diagram depicting an example of a case in which the semiconductor circuit 100 according to the embodiment of the present technology is applied as a translinear loop type fully differential amplifier.

The present translinear loop type fully differential amplifier is a circuit in which two stage amplifiers 110 and 120 are connected in series as in the first example of the semiconductor circuit 100 described hereinabove.

A chopper switch 210 is connected to the input side of the amplifier 110, and chopper switches 221 and 222 are connected to the output side of the amplifier 110. To the input side of the amplifier 120, chopper switches 231 and 232 are connected, and to the output side of the amplifier 120, a chopper switch 240 is connected.

Between the input portion of the chopper switch 231 and the output portion of the chopper switch 240, phase compensation capacitors 331 and 341 are connected by mirror connection. Further, between the input portion of the chopper switch 232 and the output portion of the chopper switch 240, phase compensation capacitors 332 and 342 are connected by mirror connection.

It is to be noted that, in FIG. 19, illustration of a common mode feedback (CMFB) circuit for determining a common mode voltage is omitted.

Minimum Selector Type Fully Differential Amplifier

FIG. 20 is a diagram of an example of a case in which the semiconductor circuit 100 according to the embodiment of the present technology is applied as a minimum selector type fully differential amplifier.

The present minimum selector type fully differential amplifier is a circuit in which two stage amplifiers 110 and 120 are connected in series as in the first example of the semiconductor circuit 100 described hereinabove.

To the input side of the amplifier 110, a chopper switch 210 is connected, and to the output side of the amplifier 110, chopper switches 221 and 222 are connected. To the input side of the amplifier 120, chopper switches 231 and 232 are connected, and to the output side of the amplifier 120, a chopper switch 240 is connected.

Between the input portion of the chopper switch 231 and the output portion of the chopper switch 240, phase compensation capacitors 331 and 341 are connected by mirror connection. Further, between the input portion of the chopper switch 232 and the output portion of the chopper switch 240, phase compensation capacitors 332 and 342 are connected by mirror connection.

Further, on the assumption that the frequency of the chopper clock is made different between the chopper switches 210, 221, and 222 and the chopper switches 231, 232, and 240, chopper switches 233 and 234 are connected also to paths for local feedback. It is to be noted that, also in the present example, illustration of the common feedback circuit is omitted.

In this manner, with the embodiment of the present technology, by connecting one end of a phase compensation capacitor to the input portion of the chopper switch connected to the input side of any of the amplifiers in the second and succeeding stages, a chopper switch can be provided on the input and output sides of each amplifier while the influence of the phase compensation capacitor is avoided. In particular, by avoiding that the phase compensation capacitor is not seen as a direct load to the amplifier in the preceding stage, characteristic deterioration of settling and the open loop gain can be avoided.

2. EXAMPLE OF APPLICATION

The semiconductor circuit 100 according to the embodiment described above can be applied to various usages as described below.

Active LPF

Figure 21:
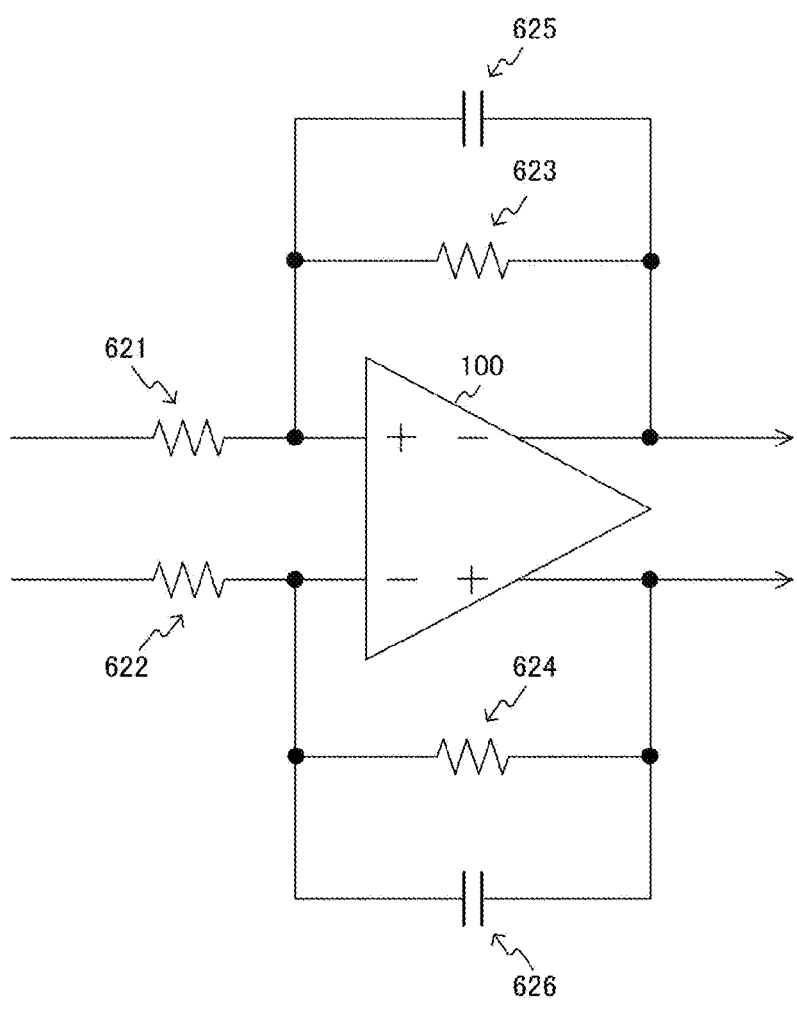
FIG. 21 is a diagram depicting an example of application of the semiconductor circuit 100 according to the embodiment of the present technology to an active LPF.

FIG. 21 is a diagram depicting an example of application of the semiconductor circuit 100 according to the embodiment of the present technology to an active LPF.

The active LPF (active Low-Pass Filter) is a low-pass filter that uses an active element. Here, an example is described in which a low-pass filter is configured with use of the semiconductor circuit 100 described hereinabove as an operational amplifier.

In the present active LPF, a resistor 621 is connected to the positive input side of the semiconductor circuit 100, and a resistor 623 and an integration capacitor 625 are connected in parallel between the positive input side and the negative output side of the semiconductor circuit 100. Further, a resistor 622 is connected to the negative input side of the semiconductor circuit 100, and a resistor 624 and an integration capacitor 626 are connected in parallel between the negative input side and the positive output side of the semiconductor circuit 100. By this, a differential-input and differential-output low-pass filter is configured.

{Switched Capacitor}

Figure 22A:
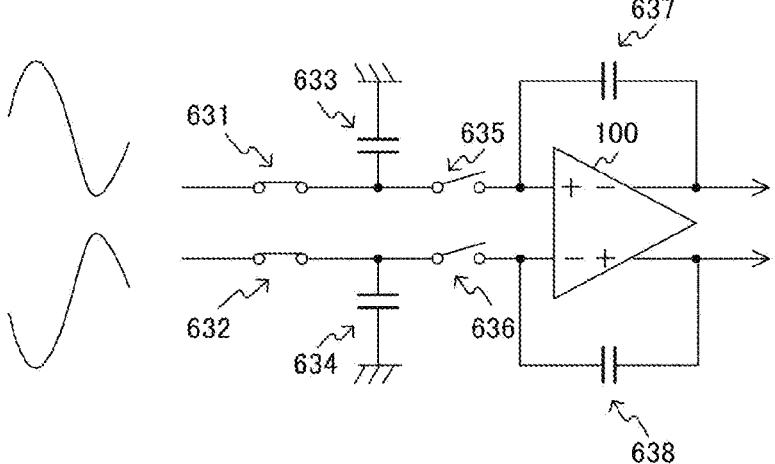
FIGS. 22A and 22B depict diagrams each depicting an example of application of the semiconductor circuit 100 according to the embodiment of the present technology to a switched capacitor.
Figure 22B:
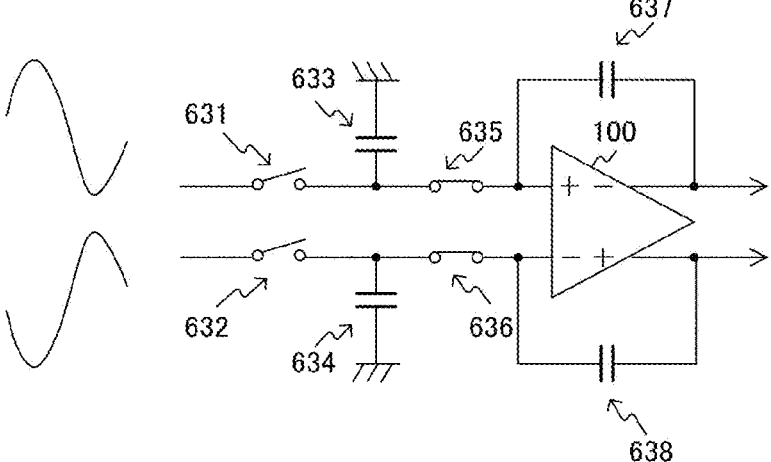

FIGS. 22A and 22B depict diagrams each depicting an example of application of the semiconductor circuit 100 according to the embodiment of the present technology to a switched capacitor.

The switched capacitor is a circuit in which switches 631, 632, 635, and 636 and capacitors (sampling capacitors 633 and 634 and integration capacitors 637 and 638) are combined to perform control of the current or the voltage.

At the time of sampling, the switches 631 and 632 are switched on while the switches 635 and 636 are switched off, as depicted in FIG. 22A. On the other hand, at the time of full charge transfer, the switches 631 and 632 are switched off and the switches 635 and 636 are switched on, as depicted in FIG. 22B. The value of the equivalent capacitance as the switched capacitor is determined by a cycle in which the actions just described are repeated. Accordingly, the current or the voltage can be controlled according to the cycle.

Analog Front End Circuit of Hall Sensor

Figure 23:
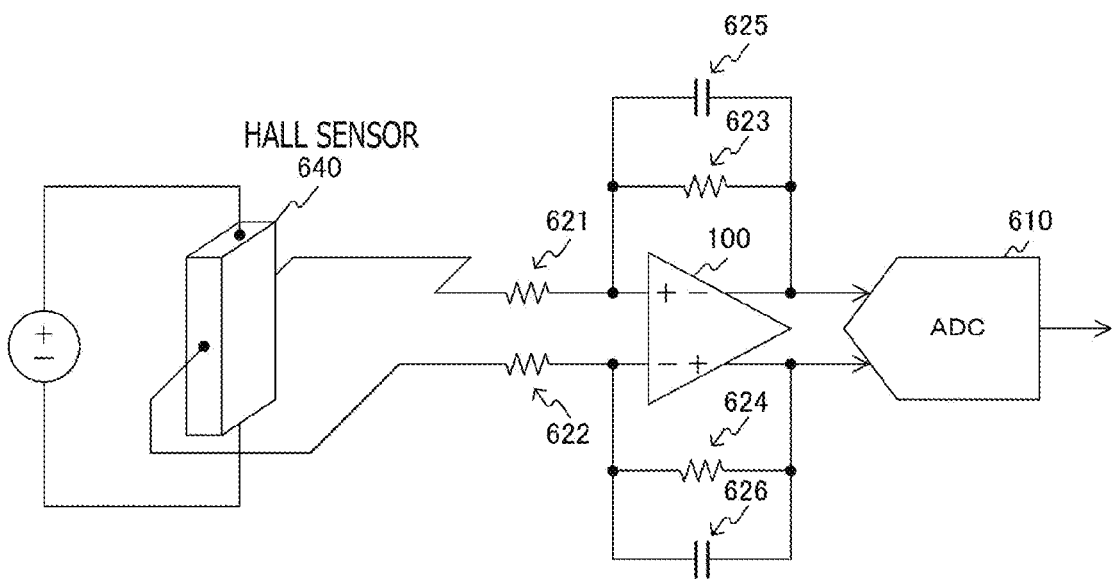
FIG. 23 is a diagram depicting an example of application of the semiconductor circuit 100 according to the embodiment of the present technology to an analog front end circuit of a hall sensor.

FIG. 23 is a diagram depicting an example of application of the semiconductor circuit 100 according to the embodiment of the present technology to an analog front end circuit of a hall sensor.

The hall sensor is a sensor that detects a magnetic field utilizing a hall effect. The hall sensor 640 converts a magnetic field into an electric signal utilizing the hall effect and outputs the electric signal. For the output of the hall sensor 640, the analog front end circuit cuts high frequency components with the active LPF described hereinabove and supplies a resulting signal to the ADC 610. By this, an analog signal obtained by the hall sensor 640 can be converted into a digital signal and outputted as the digital signal.

Analog Front End of Biosensor

FIG. 24 is a diagram depicting an example of application of the semiconductor circuit 100 according to the embodiment of the present technology to an analog front end circuit of a biosensor.

The biosensor is a sensor that detects a biological signal generated by a biological phenomenon of a living thing. As the biological signal, for example, a brain wave (EEG: electroencephalogram) is available. The analog front end circuit of the biosensor includes operational amplifiers 651 and 652 that amplify a biological signal, and a switched capacitor 630 provided in the stage following them. The switched capacitor 630 includes the semiconductor circuit 100 as in the examples described above and controls the current or the voltage. An analog signal obtained by the semiconductor circuit 100 is supplied to the ADC 610. Consequently, the analog signal obtained by the biosensor can be converted into a digital signal and outputted as the digital signal.

As indicated by the examples of application, the semiconductor circuit 100 according to the embodiment of the present technology can be applied as a fully differential amplifier to various usages.

It is to be noted that the foregoing embodiment represent an example for embodying the present technology, and matters in the embodiment have respective correspondence relations to inventive specific matters in claims. Similarly, the inventive specific matters in the claims have respective correspondence relations to matters in the embodiment of the present technology which matters are given names identical to those of the inventive specific matters in the claims. However, the present technology is not limited to the embodiment and can be embodied by making various modifications to the embodiment without departing from the spirit of the present technology.

It is to be noted that the effects described in the present specification are merely illustrative and are not limited, and that there may be other effects.

It is to be noted that the present technology can also have such configurations as described below.

(1) A semiconductor circuit including:

a plurality of amplifiers that is connected in series and individually amplify and supply a signal on an input side thereof to an output side thereof;

first and second chopper switches that are connected to an input side and an output side of a first amplifier connected first among the plurality of amplifiers, respectively, to act in synchronism with a first chopper clock;

third and fourth chopper switches that are connected to an input side and an output side of a second amplifier connected second or later among the plurality of amplifiers, respectively, to act in synchronism with a second chopper clock; and a phase compensation capacitor connected at one end thereof to an input portion of the third chopper switch.

(2) The semiconductor circuit according to (1) above, in which the phase compensation capacitor is connected at the other end thereof to a stage later than an output portion of the fourth chopper switch by mirror connection.

(3) The semiconductor circuit according to (1) above, in which the phase compensation capacitor is connected at the other end thereof to a power supply potential or a ground potential.

(4) The semiconductor circuit according to any one of (1) to (3) above, in which the first and second chopper clocks are the same signal.

(5) The semiconductor circuit according to any one of (1) to (3) above, in which the second chopper clock is delayed for a predetermined period of time from the first chopper clock.

(6) The semiconductor circuit according to (5) above, further including:

a delay circuit that delays the first chopper clock for the predetermined period of time to generate the second chopper clock.

(7) The semiconductor circuit according to any one of (1) to (3) above, in which the first and second chopper clocks have frequencies different from each other.

(8) The semiconductor circuit according to (7) above, further including:

a frequency divider that generates, from one of the first and second chopper clocks, the other of the first and second chopper clocks.

(9) The semiconductor circuit according to any one of (1) to (3) or (7) above, further including:

a phase synchronization circuit that generates a reference signal; and a frequency divider that generates the first and second chopper clocks on the basis of the reference signal.

(10) The semiconductor circuit according to any one of (1) to (9) above, in which the plurality of amplifiers is each a differential-input and differential-output fully differential amplifier, each of the first to fourth chopper switches performs switching between an action for passing differential input signals therethrough and another action for crossing the differential input signals in synchronism with the first or the second chopper clock and outputs resulting signals as differential output signals, and the phase compensation capacitor is connected to each of differential input portions of the third chopper switch.

(11) The semiconductor circuit according to (10) above, in which the plurality of amplifiers is each a translinear loop type fully differential amplifier.

(12) The semiconductor circuit according to (10) above, in which the plurality of amplifiers is each a minimum selector type fully differential amplifier.

REFERENCE SIGNS LIST

100: Semiconductor circuit
110, 120, 130: Amplifier
210, 220, 221, 222, 230, 231, 232, 240, 250, 260: Chopper switch
330, 331, 332, 333, 334, 340, 341, 342, 343, 350, 353, 360, 363: Phase compensation capacitor
410: Delay circuit
521, 522: Frequency divider
610: ADC
621 to 624: Resistor
625, 626, 637, 638: Integration capacitor
630: Switched capacitor
631, 632, 635, 636: Switch
633, 634: Sampling capacitor
640: Hall sensor
651, 652: Operational amplifier

The invention claimed is:

1. A semiconductor circuit, comprising:
a plurality of amplifiers, wherein
    each of the plurality of amplifiers is in a series connection, and
    the each of the plurality of amplifiers is configured to:
        receive a signal;
        amplify the received signal; and
        output the amplified signal;
a first chopper switch connected to an input side of a first amplifier of the plurality of amplifiers;
a second chopper switch connected to an output side of the first amplifier, wherein the first chopper switch and the second chopper switch are configured to act in synchronism with a first chopper clock;
a third chopper switch connected to an input side of a second amplifier of the plurality of amplifiers;
a fourth chopper switch connected to an output side of the second amplifier, wherein
    a position of the second amplifier is subsequent to a position of the first amplifier in the series connection,
    the third chopper switch and the fourth chopper switch are configured to act in synchronism with a second chopper clock, and
    the each of the first chopper switch, the second chopper switch, the third chopper switch, and the fourth chopper switch is configured to:
        switch between a first action to pass a plurality of differential input signals, and a second action to cross the plurality of differential input signals in synchronism with one of the first chopper clock or the second chopper clock; and
        output, as a plurality of differential output signals, one of the passed plurality of differential input signals or the crossed plurality of differential input signals; and
a first phase compensation capacitor that includes a first end, wherein the first end of the first phase compensation capacitor is connected to a first differential input portion of the third chopper switch.

2. The semiconductor circuit according to claim 1, further comprising a second phase compensation capacitor, wherein
    the first phase compensation capacitor further includes a second end,
    the second end of the first phase compensation capacitor is connected an output portion of the fourth chopper switch, and the first phase compensation capacitor and the second phase compensation capacitor are in a mirror connection.

3. The semiconductor circuit according to claim 1, wherein the first phase compensation capacitor further includes a second end, and the second end of the first phase compensation capacitor is connected to at least one of a power supply potential or a ground potential.

4. The semiconductor circuit according to claim 1, wherein the first chopper clock and the second chopper clock are a same signal.

5. The semiconductor circuit according to claim 1, wherein the second chopper clock has a delay of a specific period of time from the first chopper clock.

6. The semiconductor circuit according to claim 5, further comprising a delay circuit configured to:

delay the first chopper clock for the specific period of time; and generate the second chopper clock based on the delayed first chopper clock.

7. The semiconductor circuit according to claim 1, wherein a frequency of the first chopper clock is different from a frequency of the second chopper clock.

8. The semiconductor circuit according to claim 7, further comprising a frequency divider configured to generate one of the first chopper clock based on the second chopper clock, or the second chopper clock based on the first chopper clock.

9. The semiconductor circuit according to claim 1, further comprising:

a phase synchronization circuit configured to generate a reference signal; and a frequency divider configured to generate, based on the reference signal, each of the first chopper clock and the second chopper clock.

10. The semiconductor circuit according to claim 1, further comprising a second phase compensation capacitor, wherein the each of the plurality of amplifiers is a differential-input and differential-output fully differential amplifier, and the second phase compensation capacitor is connected to a second differential input portion of the third chopper switch.

11. The semiconductor circuit according to claim 10, wherein the each of the plurality of amplifiers is a translinear loop type fully differential amplifier.

12. The semiconductor circuit according to claim 10, wherein the each of the plurality of amplifiers is a minimum selector type fully differential amplifier.

* * * * *